(12) United States Patent
Sousa et al.

(10) Patent No.: US 7,683,695 B2
(45) Date of Patent: Mar. 23, 2010

(54) CIRCUITS AND METHODS FOR CANCELING SIGNAL DEPENDENT CAPACITANCE

(75) Inventors: Joseph L. Sousa, Lawrence, MA (US); David M. Thomas, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 11/506,338

(22) Filed: Aug. 18, 2006

(65) Prior Publication Data

US 2007/0103845 A1 May 10, 2007

Related U.S. Application Data

(60) Provisional application No. 60/709,566, filed on Aug. 18, 2005.

(51) Int. Cl.
*H03K 17/16* (2006.01)

(52) U.S. Cl. ....................... 327/382; 327/362

(58) Field of Classification Search ................. 327/362, 327/382

See application file for complete search history.

(56) References Cited

U.S. PATENT DOCUMENTS

| | | | |
|---|---|---|---|
| 6,348,862 B1 * | 2/2002 | McDonnell et al. | 340/562 |
| 6,480,052 B1 * | 11/2002 | Pettersen | 327/382 |
| 6,522,187 B1 | 2/2003 | Sousa | |
| 6,556,053 B2 * | 4/2003 | Stanley | 327/108 |
| 6,879,215 B1 * | 4/2005 | Roach | 330/292 |
| 7,304,595 B2 * | 12/2007 | Yamaoka | 341/144 |
| 7,315,633 B2 * | 1/2008 | Funahashi | 382/124 |

* cited by examiner

*Primary Examiner*—Kenneth B. Wells
(74) *Attorney, Agent, or Firm*—McDermott Will & Emery LLP

(57) ABSTRACT

Systems and methods for reducing the magnitude of signal dependent capacitance are provided. Capacitance canceling circuitry is operative to generate cancellation capacitance in response to the magnitude of a signal, which may be the same signal that produces the undesired signal dependent capacitance, to at least partially cancel the signal dependent capacitance.

32 Claims, 24 Drawing Sheets

400

| Switched Capacitance Element (SCE) | When $V_{AB} < V_{SW}$ $C_{AB} =$ | When $V_{AB} > V_{SW}$ $C_{AB} =$ | When $V_{AB} < V_{TH}$ $C_{AB} \approx$ | When $V_{AB} > V_{TH}$ $C_{AB} \approx$ | When $V_{AB} < 0$ $C_{AB} \approx$ | When $V_{AB} > 0$ $C_{AB} \approx$ |
|---|---|---|---|---|---|---|
| SCE 100 | $C_0$ | $C_1$ | | | | |
| SCE 150 | $C_1$ | $C_0$ | | | | |
| SCE 400 | | | $C_{OX}*W*L$ | 0 | | |
| SCE 410 | | | 0 | $C_{OX}*W*L$ | | |
| SCE 420 | | | 0 | $C_{OX}*W*L$ | | |
| SCE 430 | | | $C_{OX}*W*L$ | 0 | | |
| SCE 440 | | | 0 | $C_X + C_{OX}*W*L$ | | |
| SCE 450 | | | | | 0 | $C_X$ |

FIG. 6

CIRCUITS AND METHODS FOR CANCELING SIGNAL DEPENDENT CAPACITANCE

This application claims the benefit of U.S. provisional application No. 60/709,566, filed Aug. 18, 2005, the disclosure of which is hereby incorporated by reference in its entirety.

BACKGROUND OF THE DISCLOSURE

This disclosure relates to circuits and methods for canceling signal dependent capacitance.

A common problem experienced with electronic circuitry is capacitance, as capacitance may degrade or interfere with circuit operation. Capacitance that interferes with circuit operation is sometimes referred to as parasitic capacitance.

In semiconductor devices, for example, the parasitic capacitance associated with circuits (e.g., NMOS transistors, PMOS transistors, diffused resistors, diodes, and junction capacitors) may be a function of voltage, which voltage dependency may result in unwanted distortion of voltage signals (e.g., an output voltage signal of a semiconductor device). For example, a low pass filter constructed of a diffused resistor and a metal-oxide-metal capacitor may have a voltage dependent parasitic junction capacitance associated with the diffused resistor. When a linear voltage signal is applied to the input of the filter, a non-linear current (required to charge the voltage dependent junction capacitor) flows through the resistor, resulting in a distorted voltage signal at the filter output. It will be understood that the foregoing is merely one example of how voltage dependent capacitance can cause voltage distortions in a wide variety of analog signal processing circuits. It will be further understood that capacitance may depend on signals other than voltage signals.

Accordingly, what is needed are systems and methods for canceling or reducing signal dependent capacitance.

SUMMARY OF THE DISCLOSURE

Systems and methods for reducing or canceling signal dependent capacitance are provided. Signal dependent capacitance may be canceled using capacitance canceling circuitry in accordance with the principles of the present invention. Such circuitry may produce a cancellation capacitance in response to the magnitude of a signal (e.g., a voltage signal), which may be the same signal that causes undesired signal dependent capacitance to be generated in utilization circuitry. Utilization circuitry may be any circuitry, device, or system that produces undesirable signal dependent capacitance. By electrically coupling the capacitance canceling circuitry to the utilization circuitry, the cancellation capacitance cancels out at least a portion of the signal dependent capacitance generated by the utilization circuitry.

BRIEF DESCRIPTION OF THE DRAWINGS

The above and other features of the present invention, its nature and various advantages will become more apparent upon consideration of the following detailed description, taken in conjunction with the accompanying drawings, in which like reference characters refer to like parts throughout, and in which:

FIG. 6 is a table showing the approximate capacitance of a switched capacitance element under different voltage conditions in accordance with the principles of the present invention;

DETAILED DESCRIPTION OF THE DISCLOSURE

Figure 1:
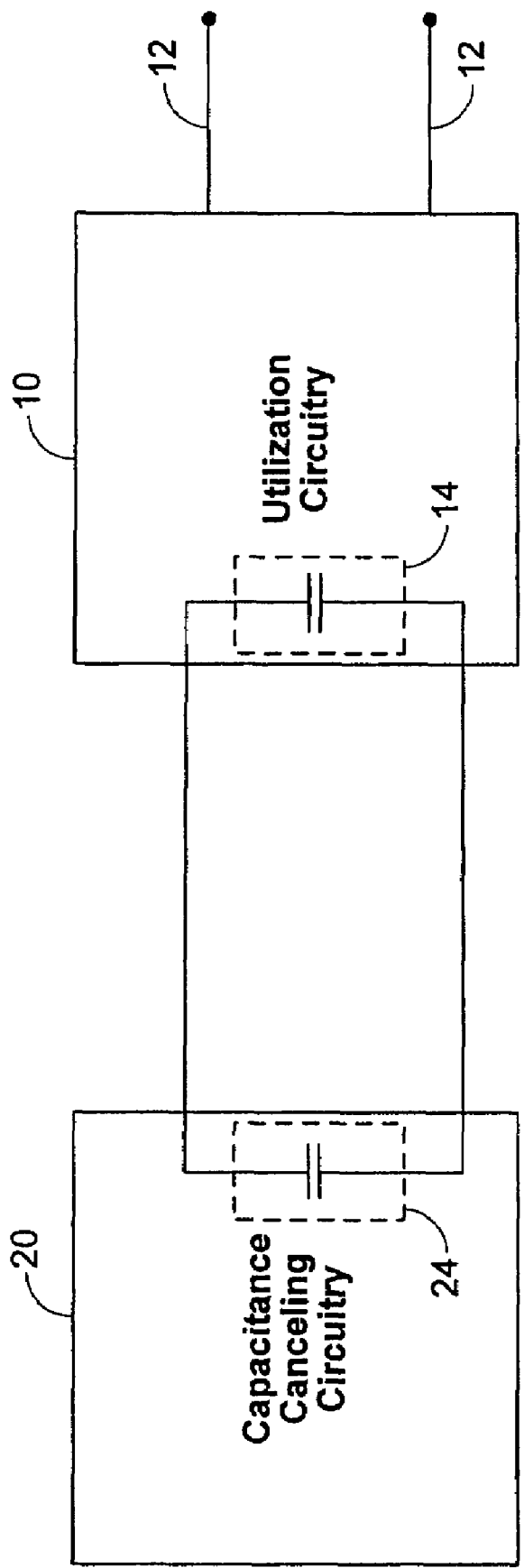
FIG. 1 shows a block diagram of capacitance canceling circuitry used in connection with utilization circuitry having signal dependent capacitance in accordance with the principles of the present invention.

FIG. 1 shows a block diagram of capacitance canceling circuitry used in connection with utilization circuitry having signal dependent capacitance in accordance with the principles of the present invention. Utilization circuitry 10 may be any type of circuitry or circuit element having voltage dependent capacitance. As shown, utilization circuitry 10 may transmit or receive a voltage on nodes 12. For purposes of clarity and to simplify the description of the invention, it is assumed herein that the signal provided on nodes 12 of utilization circuitry 10 is a voltage signal, though it will be appreciated that other forms of signals can be provided such as current, charge output, frequency, resistance signals, or a combination of such signals, including voltage signals. Linear and non-linear capacitances may form part of the parasitic capacitance (of utilization circuitry 10), which is represented graphically in FIG. 1 as a parasitic capacitor 14.

The parasitic capacitance associated with utilization circuitry 10 refers to a substantially constant capacitance in addition to voltage dependent capacitance having polynomial terms ranging from the first to the nth order. The parasitic capacitance ($C_{PAR}$) of utilization circuitry 10 may be represented mathematically in Equation 1:

$$C_{PAR}(V) = C_{PAR0} + K_1*V + K_2*V^2 \ldots + K_n*V_n \quad (1)$$

where $C_{PAR0}$ is a substantially constant capacitance that remains substantially constant independent of voltage, $K_1 \ldots K_n$ are coefficients of each order, and V, $V^2 \ldots V^n$ are voltages of each order. K1, K2 through Kn are coefficients multiplied with the same order of voltage (e.g., V, $V^2$, through $V^n$) to mathematically represent the complex dependency of $C_{PAR}(V)$. It is this voltage dependent capacitance (e.g., $K_1*V \ldots K_n*V^n$) that capacitance canceling circuitry 20 cancels out in accordance with the principles of the present invention. Note that the $K_1$ coefficient is relevant to linear capacitance and that the higher order coefficients (e.g., $K_2$, $K_3$, etc.) are primarily relevant to non-linear capacitance.

It is understood that the parasitic capacitance of some utilization circuitry may be represented by a portion of Equation 1. For example, the parasitic capacitance of utilization circuitry may include only the constant capacitance and the linear capacitance.

As defined herein, the canceling or cancellation of capacitance refers to a reduction in the magnitude of the signal dependent capacitance produced by utilization circuitry 10. The degree to which the magnitude of the signal dependent capacitance produced by utilization circuitry 10 is reduced may vary depending on a number of factors. The factors may include, for example, the magnitude range of the voltage signal, the design of the capacitance canceling circuitry, or other suitable factors. In one embodiment, the capacitance canceling circuitry may be effective in eliminating substantially all of the signal dependent capacitance such that the net signal dependent capacitance seen by utilization circuitry is practically zero or very nearly zero (e.g., about less than 10 percent of the original capacitance). In another embodiment, the capacitance canceling circuitry may be effective in reducing the magnitude of the signal dependent capacitance to enable utilization circuitry to perform its intended function or functions (e.g., produce a precisely controlled voltage).

Capacitance canceling circuitry 20 is electrically coupled to utilization circuitry 10 and is operative to cancel the voltage dependent capacitance of utilization circuitry 10. It will be understood that the term "coupled," as used herein, can define either a direct or an indirect connection between elements. Capacitance canceling circuitry 20 may cancel the voltage dependent capacitance by coupling a canceling capacitor 24 in parallel with parasitic capacitor 14. Note that canceling capacitor 24 represents a black box abstraction and may not actually be a discrete capacitor. Capacitance canceling circuitry 20 provides voltage dependent capacitance that is opposite to the voltage dependent capacitance of utilization circuitry 10, resulting in a reduction in the magnitude of the signal dependent capacitance produced by utilization circuitry 10. In addition, signal distortion due to voltage dependent capacitance may be substantially nullified using capacitance canceling circuitry 20.

Equation 2 mathematically shows the cancellation capacitance ($C_{CANCEL}$) that may be provided by capacitance canceling circuitry 20:

$$C_{CANCEL}(V) = C_{CANCEL0} - K_1*V - K_2*V^2 \ldots - K_n*V^n \quad (2)$$

where $C_{CANCEL0}$ is a substantially constant capacitance that remains substantially constant independent of voltage (or may be referred to as an intrinsic capacitance), $K_1 \ldots K_n$ are coefficients of each order, and V, $V^2 \ldots V^n$ are voltages of each order. Note that the coefficients in Equation 2 are opposite (e.g., the coefficients are negative) of the coefficients in Equation 1, indicating that $C_{CANCEL}$ has a capacitance cancellation effect on $C_{PAR}$.

Synthesis of equation 2 becomes increasingly difficult as the voltage range over which the cancellation is desired increases and as the degree of the polynomial expression in equation 2 increases. Depending on the voltage range and/or degree of non-linear variation, design choices may be made to use one of several different approaches to cancel voltage dependent capacitance. For example, for a large voltage range and a relatively high degree of non-linear variation, an approach using piece-wise linear fit, which is discussed in more detail below, may be used.

Thus, when Equations 1 and 2 are added together, the voltage dependent terms drop out, leaving only the constant terms behind, as shown in Equation 3.

$$\begin{aligned}C_{TOTAL}(V) &= C_{PAR0} + C_{CANCEL0} + K_1*V + K_2*V^2 \ldots + K_n*V^n - \\ &\quad K_1*V - K_2*V^2 \ldots - K_n*V^n \\ &= C_{PAR0} + C_{CANCEL0}\end{aligned} \quad (3)$$

After capacitance canceling circuitry 20 cancels the voltage dependent capacitance, the resulting total capacitance seen by the utilization circuitry may include only the constant terms.

Capacitance canceling circuitry 20 can be designed to cancel a predetermined number of terms. For example, the canceling circuitry may be designed to cancel the linearly dependent term, non-linear dependent terms, or a combination of both linear and non-linear dependent terms. If desired, the canceling circuitry may be designed to cancel either the even numbered or odd numbered non-linear terms in addition to or to the exclusion of the linear term.

Figure 2:
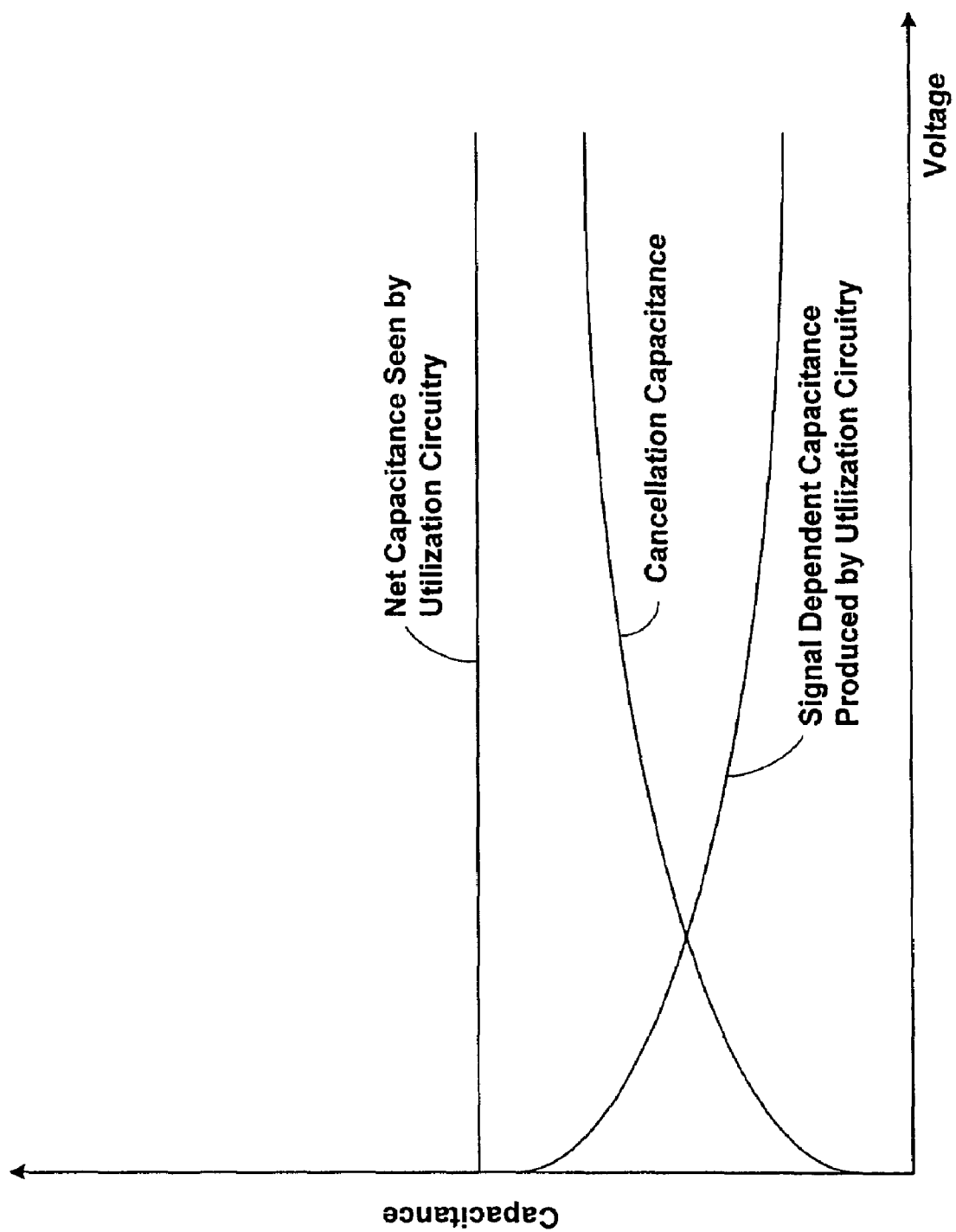
FIG. 2 graphically illustrates various capacitances as a function of voltage in accordance with the principles of the present invention.

FIG. 2 graphically illustrates capacitance as a function of voltage produced by utilization circuitry 10 and capacitance canceling circuitry 20. FIG. 2 also graphically illustrates the net capacitance seen by utilization circuitry 10 as a function of voltage. As shown, the cancellation capacitance has substantially the same but opposite magnitude of the signal dependent capacitance for a given voltage, effectively canceling the signal dependent capacitance. As a result, the net capacitance seen by utilization circuitry 10 may be equal to the combined constant parasitic capacitances of utilization circuitry 10 and canceling circuitry 20.

Figure 3A:
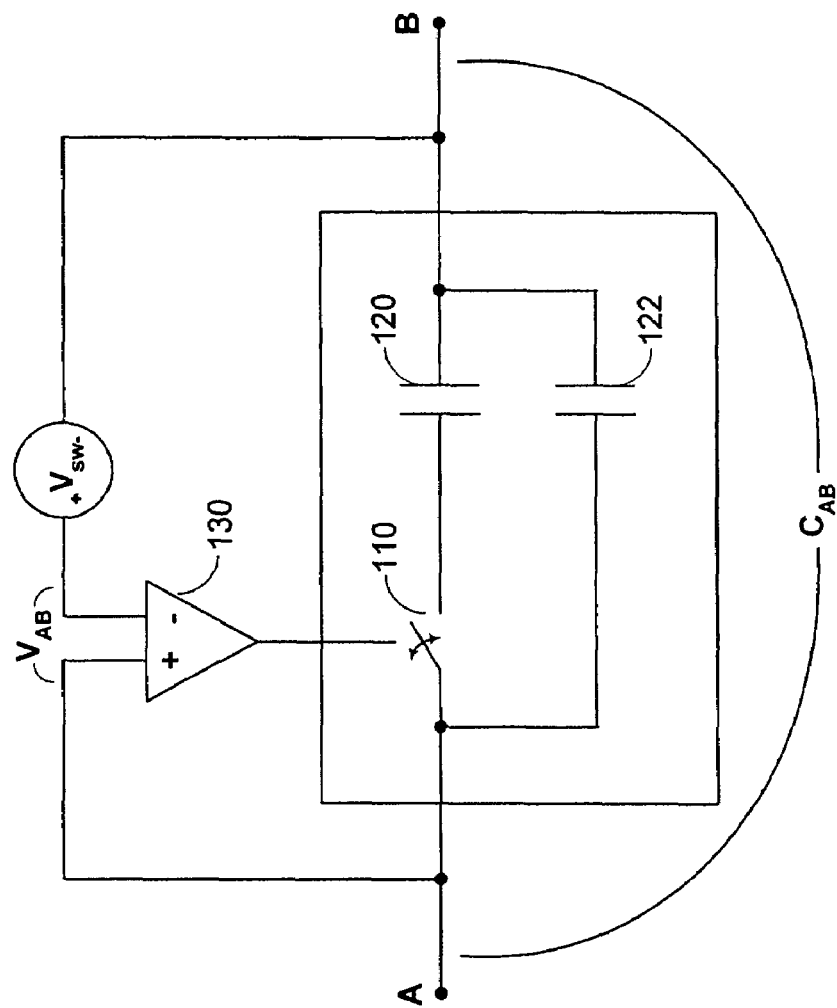
FIG. 3A shows an illustrative switched capacitance element that is in accordance with the principles of the present invention.

Capacitance canceling circuitry 20 may be constructed in any number of different ways. In one embodiment, capacitance canceling circuitry 20 may include a switched capacitance element (hereinafter "SCEs"). An SCE may provide one of at least two predetermined capacitance values in response to the magnitude of a signal (e.g., a voltage signal). FIG. 3A shows an illustrative switched capacitance element 100 that is in accordance with the principles of the present invention. SCE 100 illustrates conceptually how the capacitance across nodes A and B ($C_{AB}$) changes when the voltage across nodes A and B ($V_{AB}$) reaches a predetermined voltage. SCE 100 includes switch 110, capacitive elements 120 and 122, and comparator 130. Switch 110 may be a normally OPEN switch; that is, switch 110 is OPEN until comparator 130 provides a signal that causes switch 110 to CLOSE. Comparator 130 controls the ON and OFF state of switch 110 based on the voltage across nodes A and B and the switch voltage, $V_{SW}$, of switch 110. Note that $V_{SW}$ is coupled between the negative terminal of comparator 130 and node B. Thus, in order for switch 110 to CLOSE (e.g., turn ON), the voltage on node A has to rise $V_{SW}$ volts above the voltage on node B. When switch 110 is OPEN, $C_{AB}$ may be equivalent to a first predetermined capacitance, $C_0$. $C_0$ may be the capacitance of capacitive element 122, which may represent, for example, parasitic capacitances (e.g., gate-to-drain and gate-to-source capacitances of a SCE embodied in a MOS transistor) that are always present in an SCE. When switch 110 is CLOSED, $C_{AB}$ may be equivalent to a second predetermined capacitance, $C_1$. $C_1$ may be the combined capacitance of capacitive elements 120 and 122. Note that the capacitance of capacitive element 120 may be larger or smaller than the capacitance of capacitive element 122. FIG. 6 is a table showing the $C_{AB}$ capacitance for a given $V_{AB}$ for SCE 100.

Figure 3B:
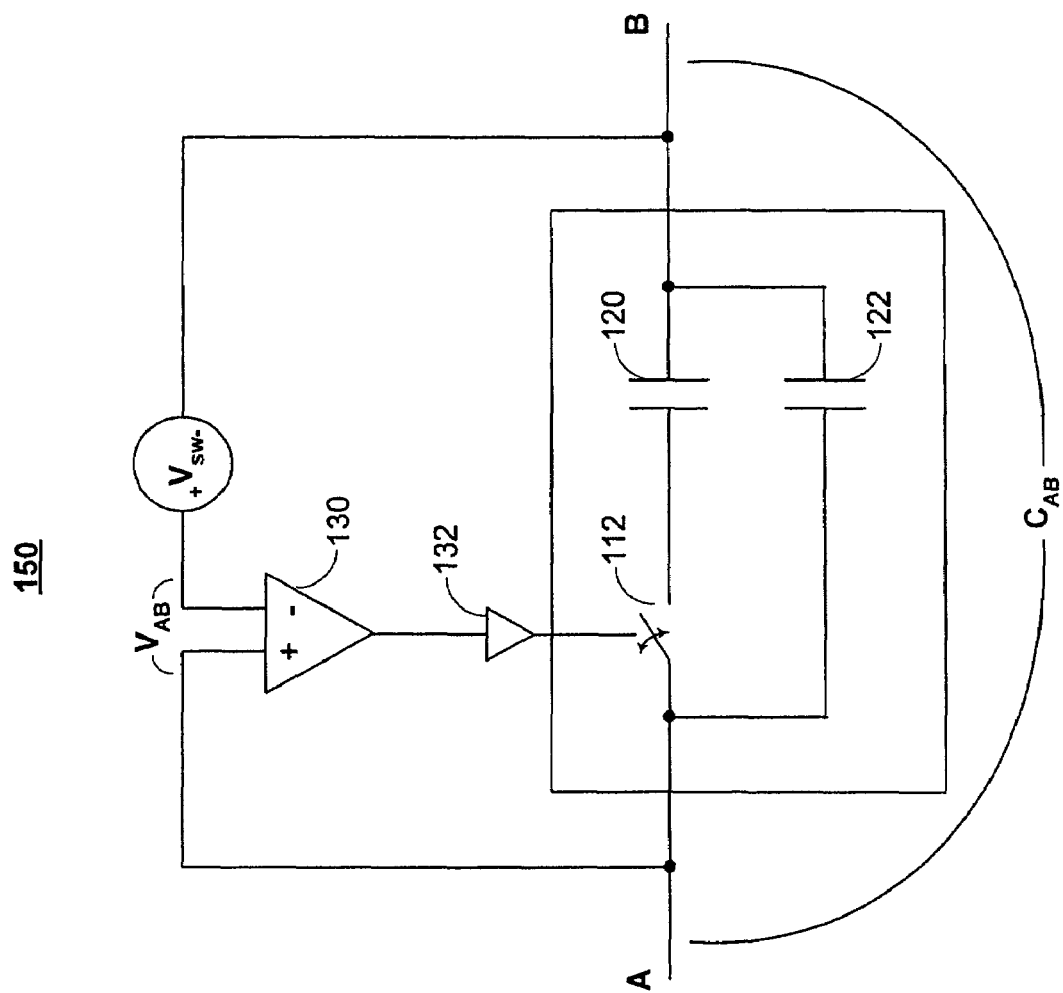
FIG. 3B shows an alternative illustrative switched capacitance element that is in accordance with the principles of the present invention.

FIG. 3B shows an illustrative switched capacitance element 150 that is in accordance with the principles of the present invention. SCE 150 is similar to SCE 100 in that it illustrates conceptually how the capacitance across nodes A and B ($C_{AB}$) changes when the voltage across nodes A and B ($V_{AB}$) reaches a predetermined voltage. SCE 150 includes switch 112, capacitive elements 120 and 122, comparator 130, and inverter 132. Switch 112 may be a normally CLOSED switch; that is, switch 112 is CLOSED until comparator 130 provides a signal that causes switch 112 to OPEN. The signal provided by comparator 130 is inverted by inverter 132. Thus, when the voltage on node A is less than the combined voltage of ($V_B+V_{SW}$), comparator 130 provides a LOW signal, which is inverted to a HIGH signal that causes switch 112 to remain CLOSED. With switch 112 closed, $C_{AB}$ is $C_1$, as indicated in FIG. 6. When the voltage on node A rises $V_{SW}$ volts above the voltage on node B, comparator 130 provides a HIGH signal, which is inverted to a LOW signal that causes switch 112 to OPEN. When switch 112 is OPEN, $C_{AB}$ is $C_0$, as also indicated in FIG. 6.

FIGS. 3A and 3B show embodiments of SCEs capable of providing one of two predetermined capacitances. It is understood that SCEs are not limited as such and may be able to selectively provide one of three or more predetermined capacitances. For example, an accumulation/off/depletion device (e.g., transistor) may selectively provide one of three capacitances based on the magnitude of a signal.

Figure 13:
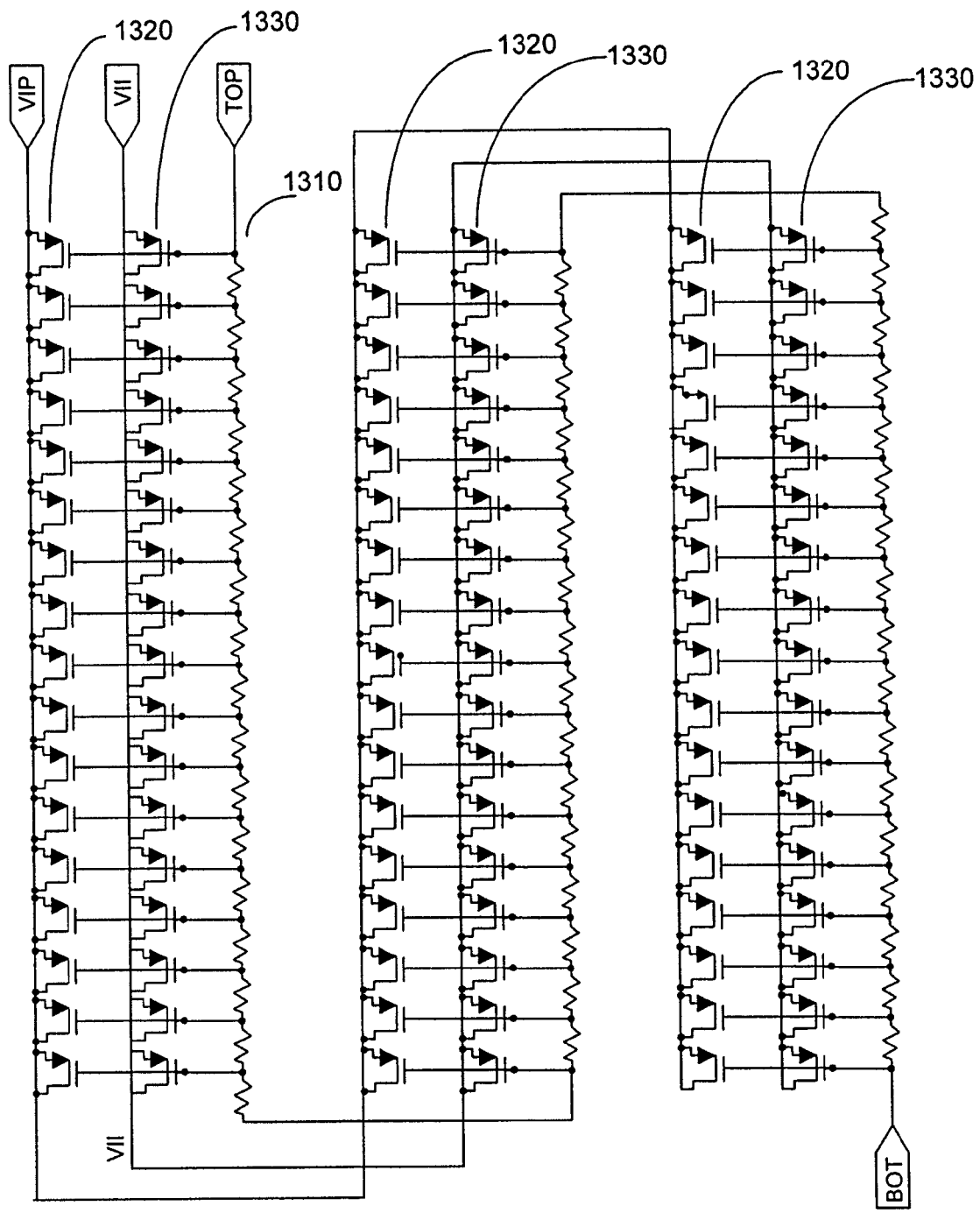
FIG. 13 shows a schematic diagram of capacitance canceling circuitry used in connection with the utilization circuitry of FIG. 12 in accordance with the principles of the present invention.

In another embodiment, capacitance canceling circuitry 20 may be constructed to use a piece-wise-linear (hereinafter "PWL") fit to provide the cancellation capacitance. PWL fit generally refers to using many small "units" to approximate or best fit a desired parameter or characteristic. In accordance with the present invention, PWL fit may be implemented using a predetermined number of SCEs to create a PWL capacitor. For example, FIG. 13 shows one embodiment where fifty SCEs may be used. In another embodiment, at least two SCEs may be used. Persons skilled in the art will appreciate that any number of SCEs may be used to generate a desired cancellation capacitance, but it is generally understood that a sufficient number of SCEs may be needed to precisely "fine-tune" the cancellation capacitance and to reduce granularity of the PWL fit. An excessive number of SCEs may not be needed to "fine-tune" the capacitance because an excessive number of SCEs may reach a point of diminishing returns.

Figure 4:
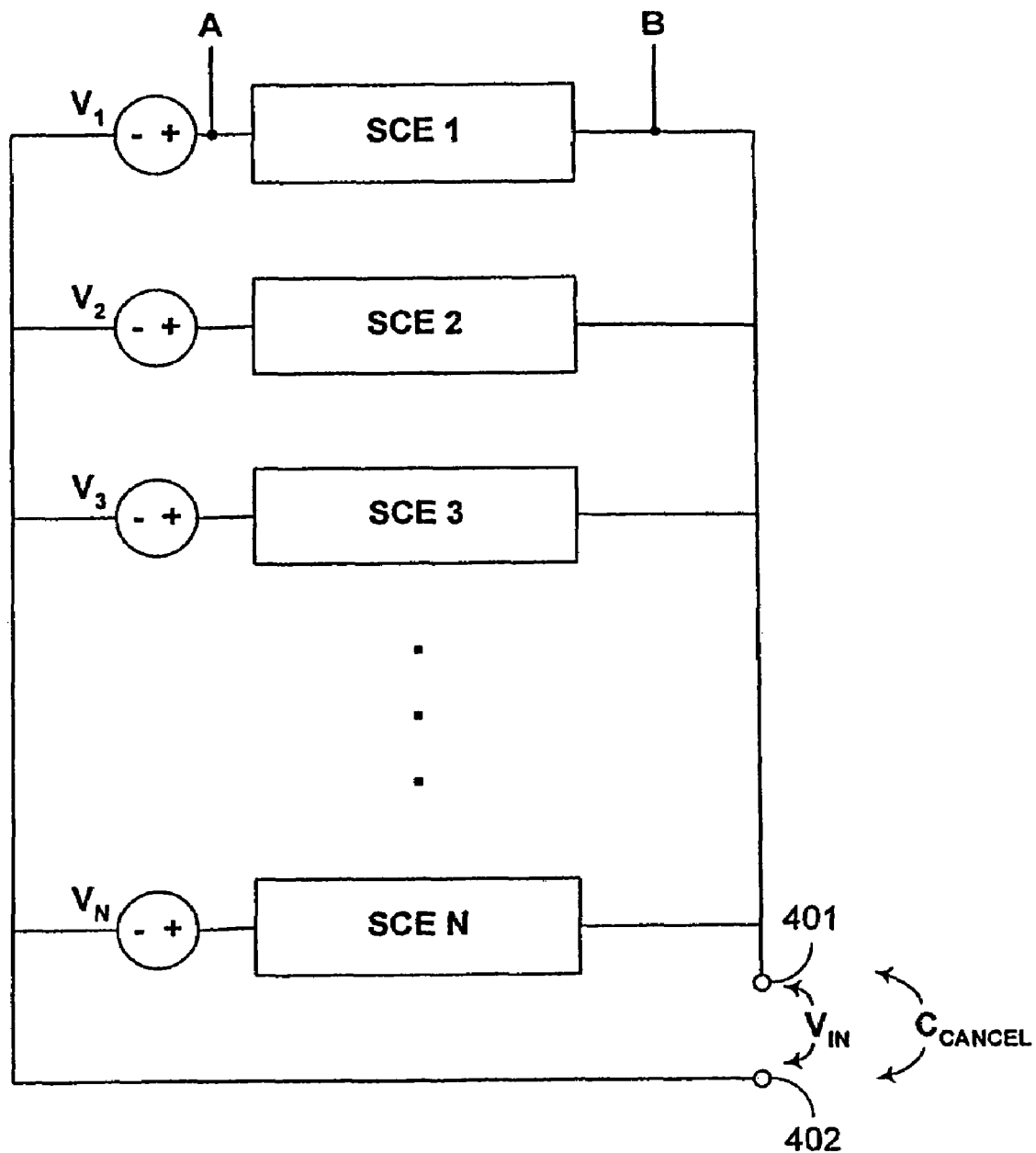
FIG. 4 shows a PWL capacitor according to the principles of the present invention that uses a predetermined number of SCEs to provide cancellation capacitance in response to a received voltage signal in accordance with the principles of the present invention.

FIG. 4 shows a PWL capacitance canceling circuitry 400 according to the principles of the present invention that uses a predetermined number of SCEs to provide cancellation capacitance in response to a received voltage signal. As shown in FIG. 4, 1 to N SCEs (such as SCEs 100 of FIG. 3A) may be used to form PWL circuitry 400. Each SCE may be connected to a voltage source, labeled as $V_1, V_2 \ldots V_N$. These voltage sources may set the voltage level at which a particular SCE changes capacitance. Each voltage source may be set to a different voltage, thereby providing a mechanism to cause each SCE to switch capacitance at different voltage thresholds.

PWL circuitry 400 is coupled to node 401 and provides cancellation capacitance, $C_{CANCEL}$, across nodes 401 and node 402 in response to voltage, $V_{IN}$, as applied across nodes 401 and 402. $V_{IN}$ may be provided by circuitry such as utilization circuitry 10 (of FIG. 1). If $V_{IN}$ is at ground, all SCEs are in the first predetermined switch capacitance mode. As $V_{IN}$ increases from zero, $SCE_N$ switches to its second predetermined capacitance when the voltage ($V_{IN}+V_{SW}$) is greater than $V_N$. Reference is made to the combination of ($V_{IN}+V_{SW}$) to determine whether the capacitance should be switched because $V_{SW}$ represents a voltage intrinsic to the SCE (e.g., a threshold voltage). As $V_{IN}$ further increases, $SCE_{N-1}$ switches to its second predetermined capacitance when the voltage ($V_{IN}+V_{SW}$) is greater than $V_{N-1}$. This pattern continues until all SCEs have switched to their second predetermined capacitance. As each SCE switches to its second predetermined capacitance, the cancellation capacitance ($C_{CANCEL}$) increases by the capacitance of the second predetermined capacitance of that SCE.

Persons skilled in the art will appreciate that SCEs in FIG. 4 can be biased by means other than voltage to set thresholds for when the switched capacitance elements switch capacitance.

Figure 5A:
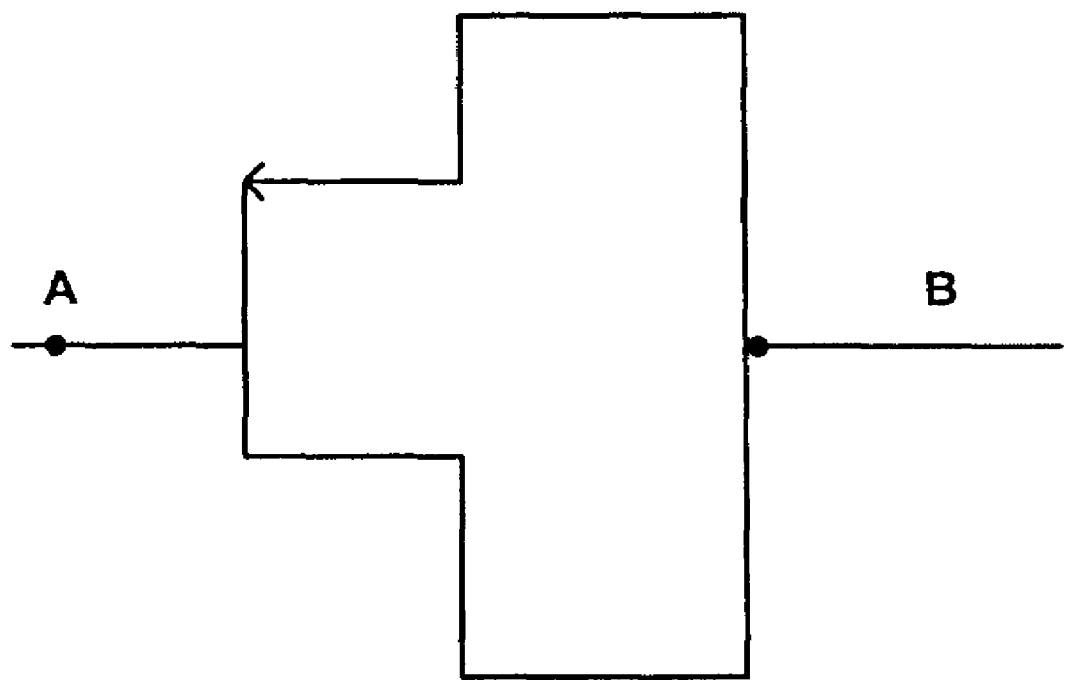
FIGS. 5A-F show several different embodiments that may be used to function as a switched capacitance element in accordance with the principles of the present invention.

It is understood that the SCE 100s represent a conceptual "black box" abstraction of a switched capacitance element and therefore can be implemented in a variety of ways. FIGS. 5A-F show several different embodiments that may be used to function as a switched capacitance element. FIGS. 5A-F are discussed in combination with FIG. 6, which shows the approximate capacitance across nodes A and B of each switched capacitance element under different voltage conditions (e.g., what $C_{AB}$ is when $V_{AB}$ is less than or greater than $V_{TH}$). Referring to FIG. 5A, SCE 500 is a PMOS transistor having its drain and source shorted together. Node A is coupled to the gate of the PMOS transistor and node B is coupled to both the drain and source. The PMOS transistor, and the other metal oxide transistors described in connection with FIGS. 5A-F, have a width and length that defines the area of the gate oxide layer. These width and length dimensions may influence the capacitance provided by the switched capacitance element. For example, when $V_{AB}$ is less than $V_{TH}$, which is the voltage required to turn a transistor ON or OFF, depending on the type of transistor, $C_{AB}$ may be approximately equal to $C_{OX}*W*L$, because the PMOS transistor is ON. Note that $V_{TH}$ is analogous to $V_{SW}$ of SCE 100 and $C_{OX}$ refers to the capacitance due to the dielectric constant of the gate oxide divided by the dielectric thickness. When $V_{AB}$ is greater than $V_{TH}$, the PMOS transistor is OFF and $C_{AB}$ is negligible (e.g., merely represents parasitic capacitance).

Figure 5B:
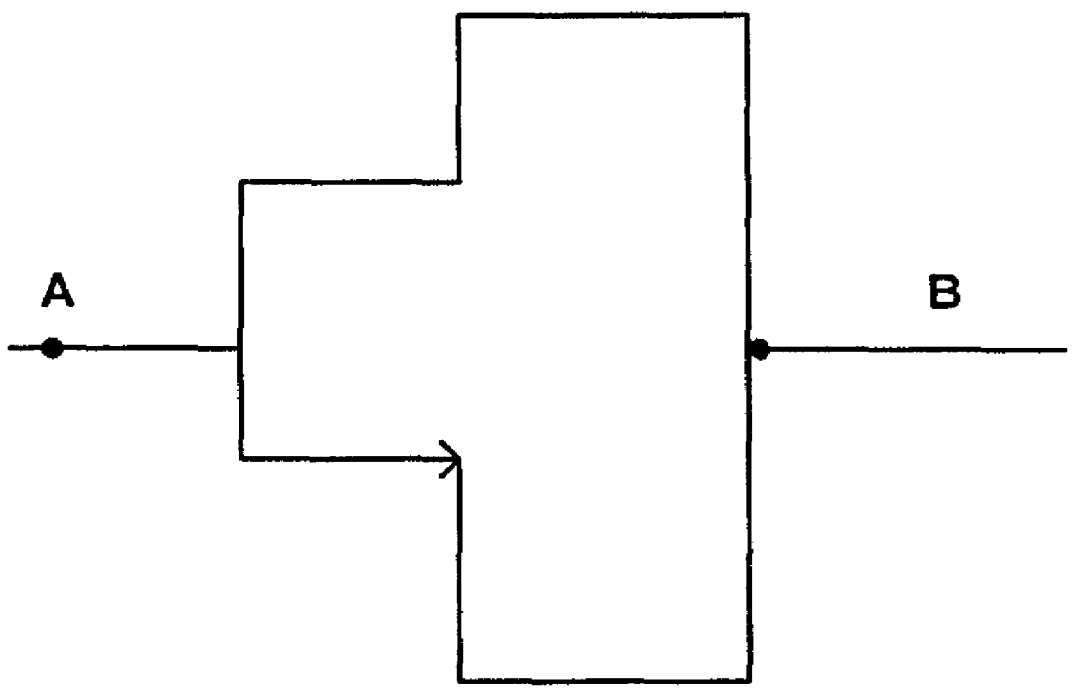

FIG. 5B shows SCE 510, which is a NMOS transistor having its drain and source shorted together. Node A is coupled to the gate of the NMOS transistor and node B is coupled to both the drain and source. FIG. 6 defines the capacitance values across nodes A and B for given voltages across those same nodes.

Figure 5C:
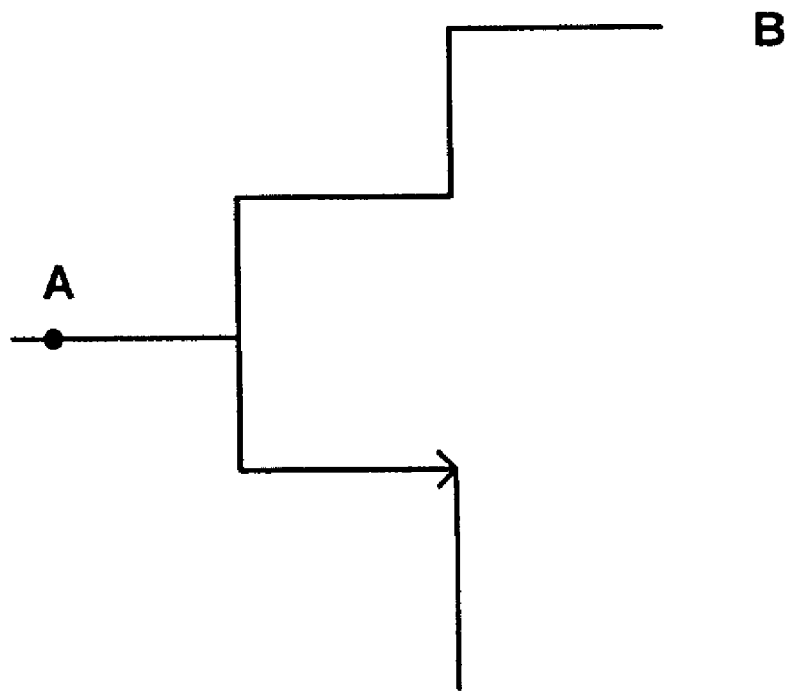

FIG. 5C shows SCE 520, which is a NMOS transistor having its source open, its gate coupled to node A, and its drain coupled to node B. Persons skilled in the art will appreciate that SCE 520 can be configured different than that shown in FIG. 5C. For example, the drain may be open, and node B may be connected to the source.

Figure 5D:
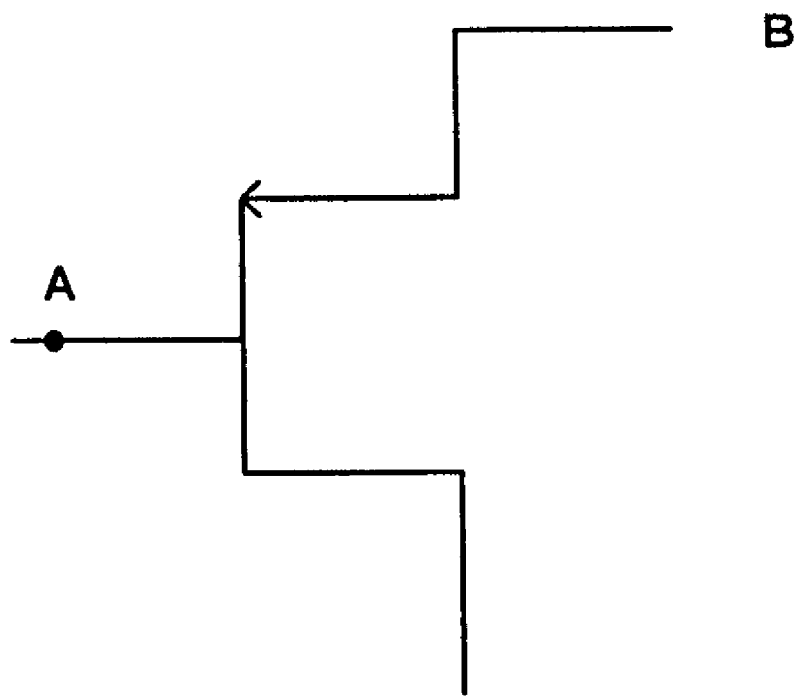

FIG. 5D shows SCE 530, which is a PMOS transistor having its drain open, its gate coupled to node A, and its source coupled to node B. Persons skilled in the art will appreciate that SCE 530 can be configured different than that shown in FIG. 5D. For example, the drain may be open, and node B may be connected to the source.

Figure 5E:
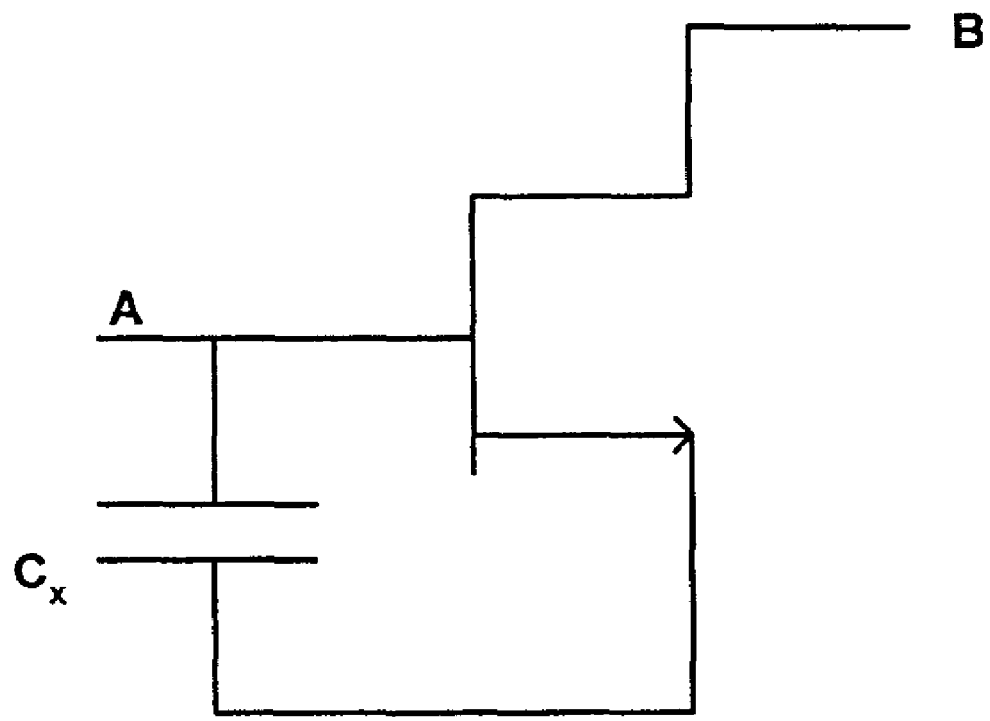

FIG. 5E shows SCE 540, which is a NMOS transistor having an additional capacitor $C_X$ coupled between the gate and source. As indicated in FIG. 6, this additional capacitor increases the capacitance of SCE 540 by $C_X$ when $V_{AB}$ is greater than $V_{TH}$. Node A is coupled to the gate and node B may be coupled to the drain.

Figure 5F:
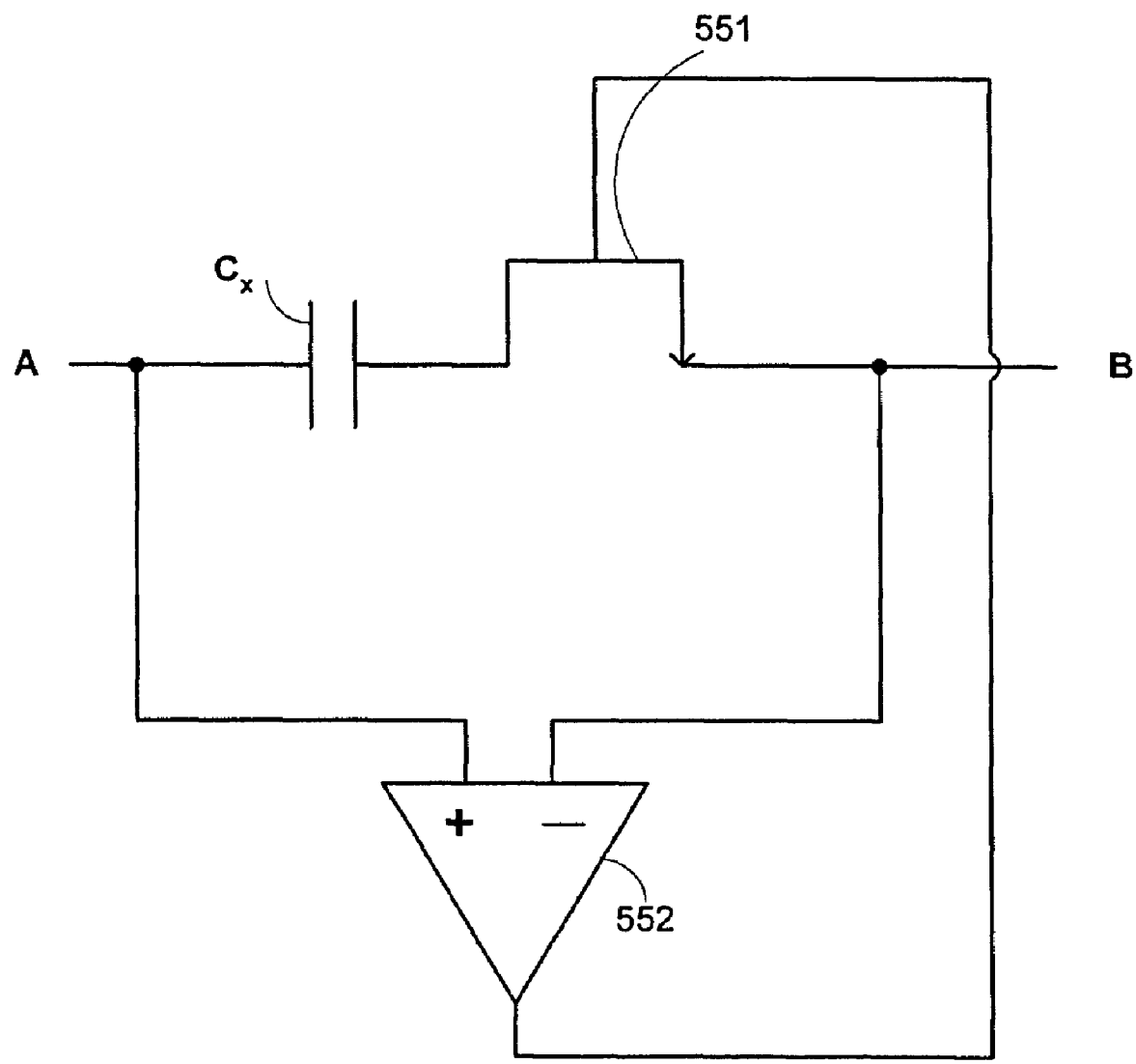

FIG. 5F shows SCE 550, which is a NMOS transistor 551 operating in connection with comparator circuit 552. During operation of SCE 550, when $V_{AB}$ exceeds a predetermined voltage (e.g., 0 volts), comparator 552 applies a turn ON voltage to the gate of transistor 551, causing transistor 551 to turn ON, thereby coupling capacitor $C_X$ to node B. During operation of SCE 550, the capacitance of SCE 550 may switch from a negligible capacitance (when $V_{AC}$ is less than the predetermined voltage) to $C_X$ when $V_{AC}$ exceeds the predetermined voltage.

Persons skilled in the art will appreciate that SCEs can be constructed using other circuit elements not specifically mentioned herein. For example, bipolar junction transistors may be utilized to perform SCE functionality.

Figure 7:
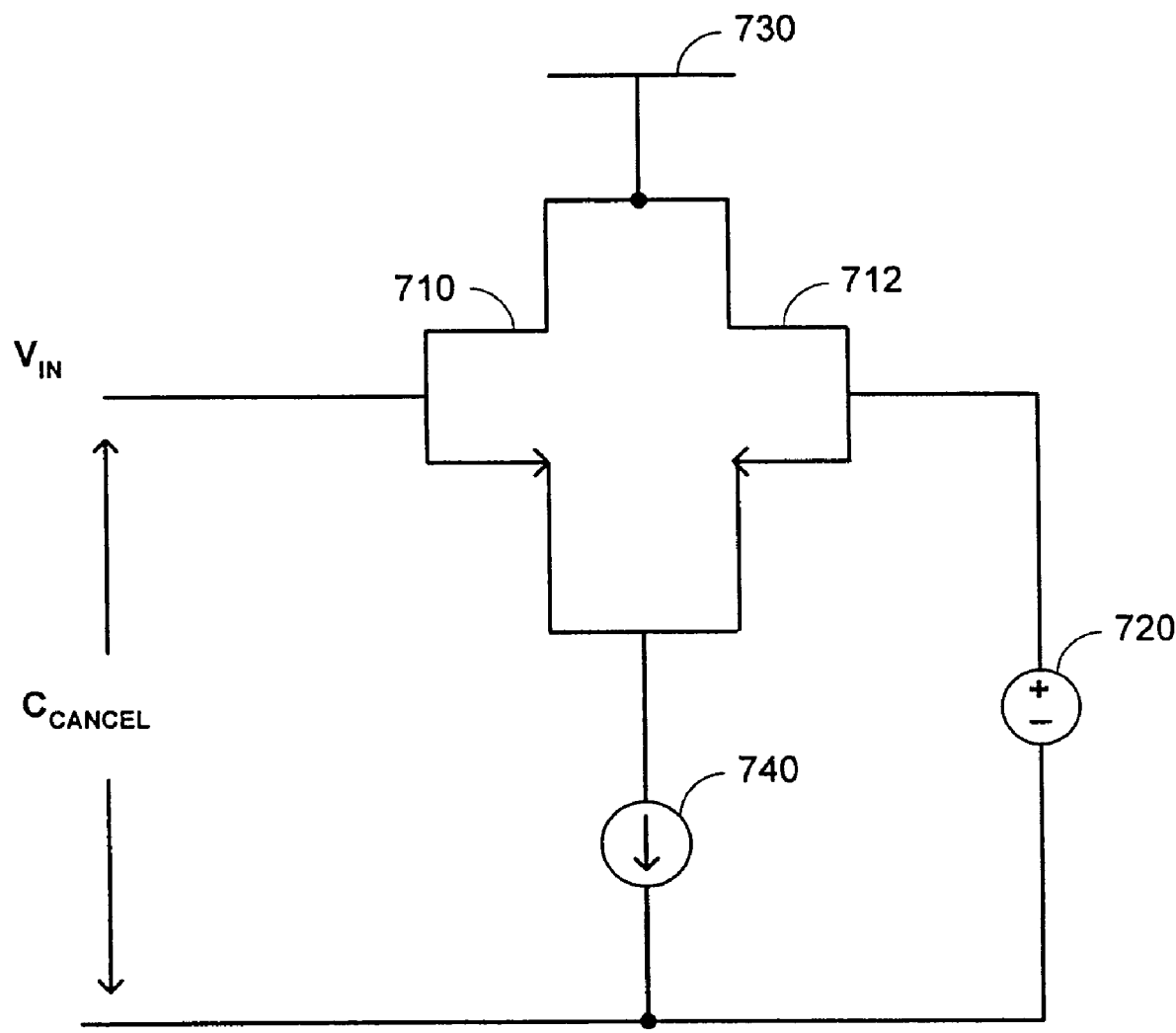
FIG. 7 shows a simplified schematic diagram of capacitance canceling circuitry in accordance with the principles of the present invention.

It is understood that circuitry other than SCEs may be used to cancel signal dependent capacitance. For example, an op-amp may be used to provide cancellation capacitance. FIG. 7 shows an embodiment of capacitance canceling circuitry 700 that may be used to generate cancellation capacitance, or more particularly, nonlinear cancellation capacitance. Canceling circuitry 700 includes a differential pair of transistors 710 and 712 (e.g., NMOS transistors), bias voltage source 720, voltage source 730, and current source 740 connected as shown. The operation of canceling circuitry 700 is discussed in connection with FIG. 7A, which shows the cancellation capacitance ($C_{CANCEL}$) generated by circuitry 700 as a function of voltage ($V_{IN}$) received by circuitry 700.

When the input voltage, $V_{IN}$, increases to a threshold voltage above the source of transistor 712, transistor 710 may start to turn ON. When transistor 710 turns ON, the cancellation capacitance, Ccancel, begins to increase until Vin is substantially equal to bias voltage source 720. When Vin and the bias voltage are substantially equal, a maximum cancellation capacitance is generated (e.g., a capacitance approximately equal to one-half of the gate-to-source capacitance of transistor 710). As the voltage further increases, the cancellation capacitance begins to decrease as transistor 712 begins to turn OFF, which occurs when the source of transistor 710 is one threshold voltage below bias voltage 720. As shown, the cancellation capacitance may decrease to nearly zero when a predetermined input voltage is obtained. Note transistor 710 operates as a source follower, and as such the capacitance looking into the gate of a source follower may be approximately zero. The capacitance provided by circuitry 700 can be adjusted by changing the voltage of bias voltage 720, changing the size of transistors 710 and 712, or changing the current level provided by current source 740.

Figure 8:
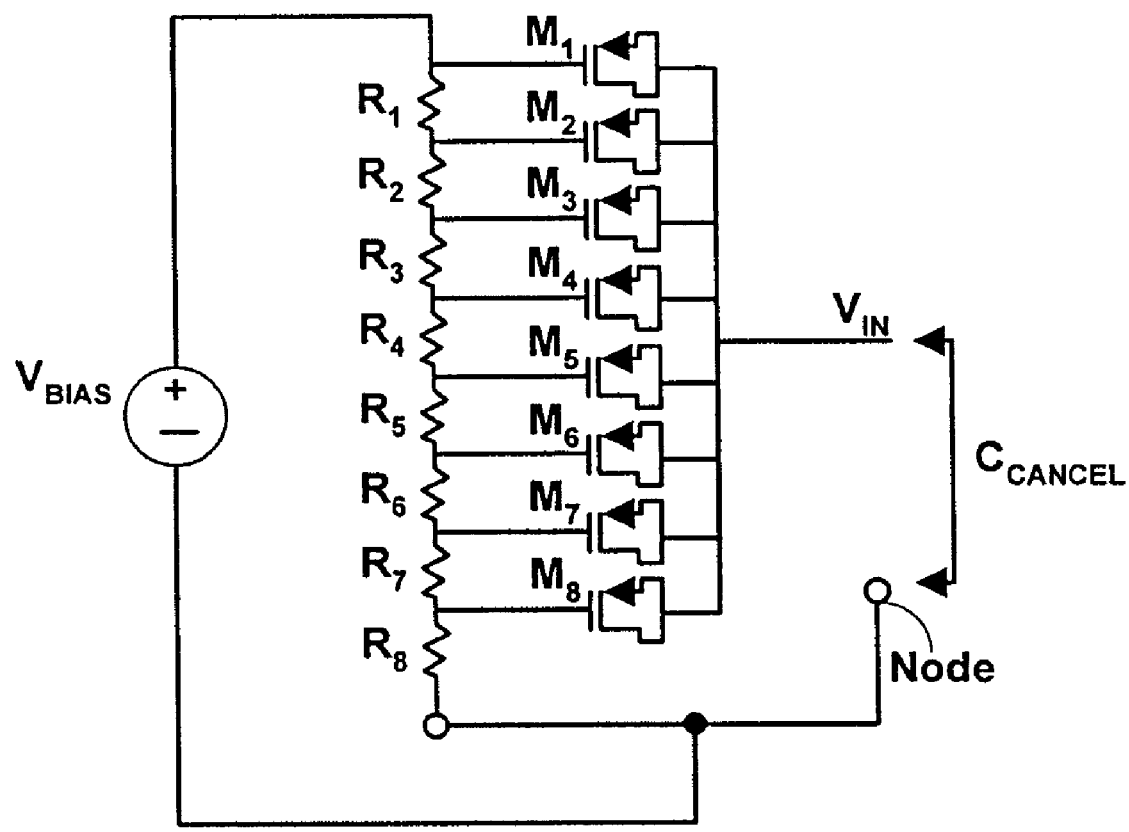
FIG. 8 shows a simplified schematic diagram of capacitance canceling circuitry in accordance with the principles of the present invention.

FIG. 8 shows PWL capacitance canceling circuitry 800 constructed using SCE 500 of FIG. 5A. PWL circuitry 800 includes eight SCE 500, labeled here as M1-M8, eight resistors, labeled $R_1$-$R_8$, connected in series between $V_{BIAS}$ and GROUND. The resistor tree functions as a voltage divider that provides voltage divided voltage(s) to the gate of each SCE. This voltage divided voltage is analogous to the voltage provided by the voltage sources (e.g., $V_1, V_2 \ldots V_N$) shown in FIG. 4. The drains and sources of each transistor are coupled to $V_{IN}$.

PWL circuitry 800 operates similar to that of PWL circuitry 400 discussed above in connection with FIG. 4. For example, if the input terminal, $V_{IN}$, is at ground, all MOS transistors M1-M8 are OFF. As the voltage increases from zero at $V_{IN}$, M8 turns ON when the input voltage is greater than the voltage on the gate plus the threshold voltage. As the input voltage is further increased, M7 turns ON, then M6 and so on until all transistors are ON. As each transistor turns ON, the capacitance to AC ground at $V_{IN}$ will increase by approximately (W*L) ($C_{OX}$). If equal sized transistors and resistors are used, the capacitance at $V_{IN}$ may have a first order voltage dependence that increases as the input voltage increases, roughly described by Equation 4.

$$C_{CANCEL}(V) = K_1 * V \qquad (4)$$

Because this is a PWL fit, equation 4 is merely an approximation.

A practical example of where PWL circuitry 800 may be used is in an analog to digital converter sample and hold circuit. In many sample and hold circuits the second order distortion is dominated by nonlinear parasitic capacitance of NMOS transistors. The N+ diffusion capacitance of the NMOS transistors may have a very strong first order voltage dependence that decreases as the input voltage increases. By adding a properly sized version of PWL circuitry 800, which has a first order capacitance that increases as the voltage increases, the voltage dependence of the capacitance can be cancelled, improving the second order distortion.

Non-linear cancellation capacitance (e.g., for second, third, and other terms) can be generated by using scaled sizes for the transistors or resistors. Although for consistent voltage granularity across the operation range it may be desirable to maintain equal resistor size. Referring to FIG. 8, a second order capacitance versus voltage function can be generated by linearly scaling the widths of each MOS transistor M1 to M8. If desired, a staggered scaling of the widths of each MOS transistor may be used to provide third order scaling. Staggering of widths may be accomplished by incrementally increasing the width of each transistor (e.g., M1 to M8). For example, M8 may have a width of X, M7 may have a width of 1.1*X, M6 may have a width of 1.2*X, and so on. In another embodiment, the resistor taps can be linearly scaled to provide second and third order scaling.

Figure 9:
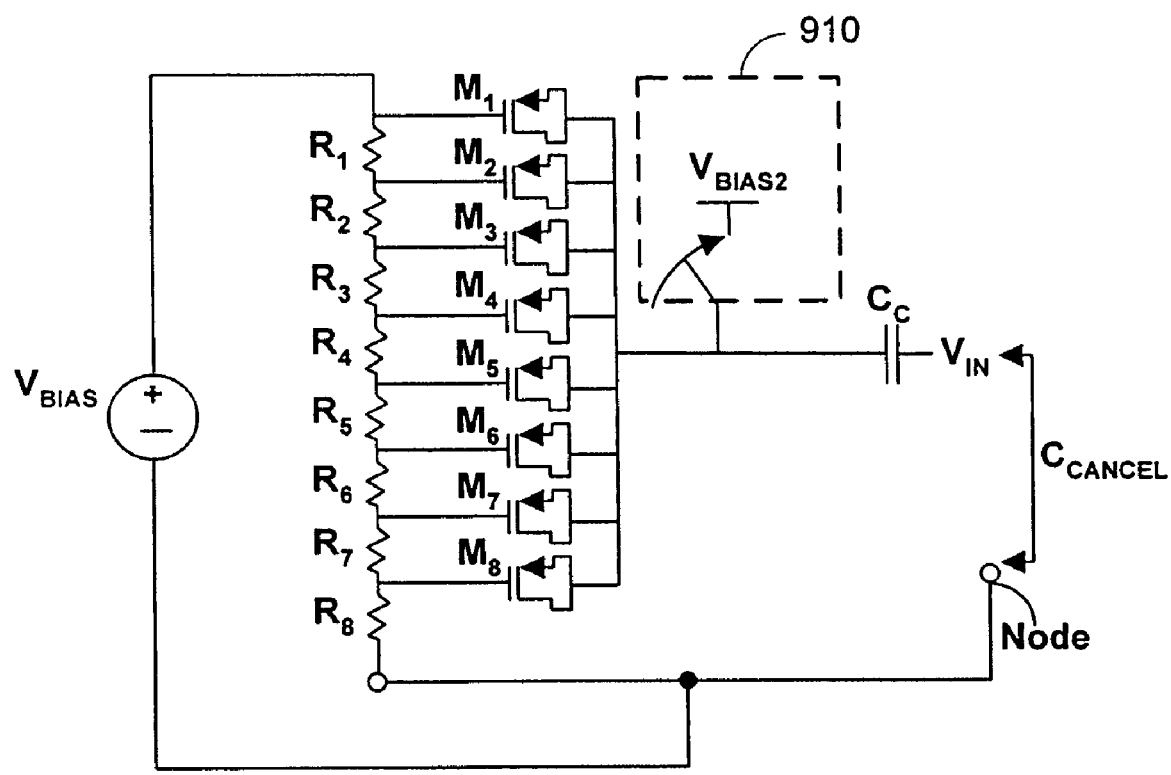
FIG. 9 shows a simplified schematic diagram of alternative capacitance canceling circuitry in accordance with the principles of the present invention.

The threshold voltage of the MOS transistors may cause the range of operation for PWL circuitry 800 to not match the required range of operation. Such mismatches in range operation can be taken into account by using a voltage shifter and/or a coupling capacitor, as shown in FIG. 9. As shown, PWL canceling circuitry 900 is similar to PWL canceling circuitry 800 of FIG. 8, but includes coupling capacitor Cc and voltage shifting circuitry 910. Coupling capacitor $C_C$ may be coupled to the sources and drains of transistors M1-M8. Voltage shifting circuitry 910 may include bias source $V_{BIAS2}$ and may be operative to selectively provide a voltage from $V_{BIAS2}$ to a node coupled between transistors M1-M8 and coupling capacitor $C_C$. It is understood that coupling capacitor $C_C$ and voltage shifting circuitry may be used in connection with other embodiments of the capacitance canceling circuitry.

Capacitance canceling circuitry according to the invention may be constructed with continuous capacitance canceling circuitry. Such circuitry may provide a continuous (capacitance canceling) fit as opposed to a piecewise linear fit. A continuous fit can be analogized to a piecewise linear fit having an infinite number of SCEs. Thus, continuous fit capacitance canceling circuitry may provide a very fine degree of granularity in tracking a signal.

Figure 10:
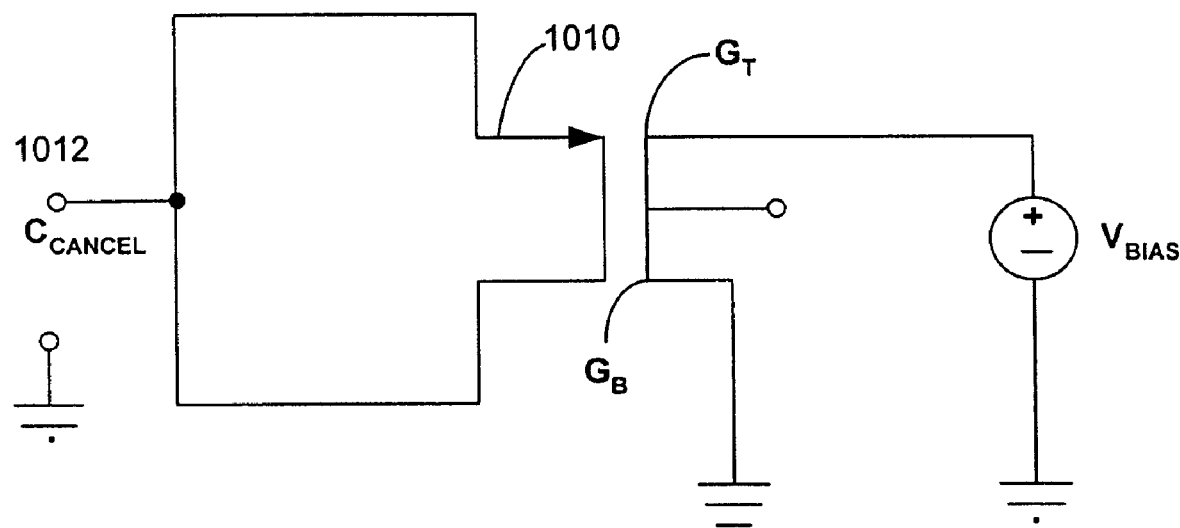
FIG. 10 shows a simplified schematic diagram of another embodiment of capacitance canceling circuitry in accordance with the principles of the present invention.

FIG. 10 shows continuous capacitance canceling circuitry 1000 in accordance with the principles of the present invention. Circuitry 1000 includes transistor 1010 having its source and drain coupled to terminal 1012 and its gate terminal open. Transistor 1010 may be a "merged" transistor in that it is a single transistor operating as a plurality of transistors merged together. For example, in order for circuitry 1000 to function similar to PWL circuitry 800, transistor 1010 may be constructed to be equivalent to all of the transistors of PWL circuitry 800 (assuming all the transistor are about the same size). Since PWL circuitry 800 has eight transistors, those eight transistor may be "merged" to form transistor 1010, which may have a gate length about eight times the gate length of any PWL circuitry 800 transistor. The gate width of transistor 1010 may be approximately the same as any PWL circuitry 800 transistor.

When the bias voltage, provided by $V_{BIAS}$, is applied across the gate from the top of the gate ($G_T$) to the bottom of the gate ($G_B$), the voltage across the gate may mimic a voltage division provided, for example, by a resistor ladder (such as that shown in FIG. 8). The voltage division across the gate is continuous, not discrete, thereby enabling circuitry 1000 to provide a continuous fit capacitance cancellation in response to a signal (e.g., voltage signal). That is, as the voltage on terminal 1012 increases, there may be a proportional increase in the cancellation capacitance.

Figure 10A:
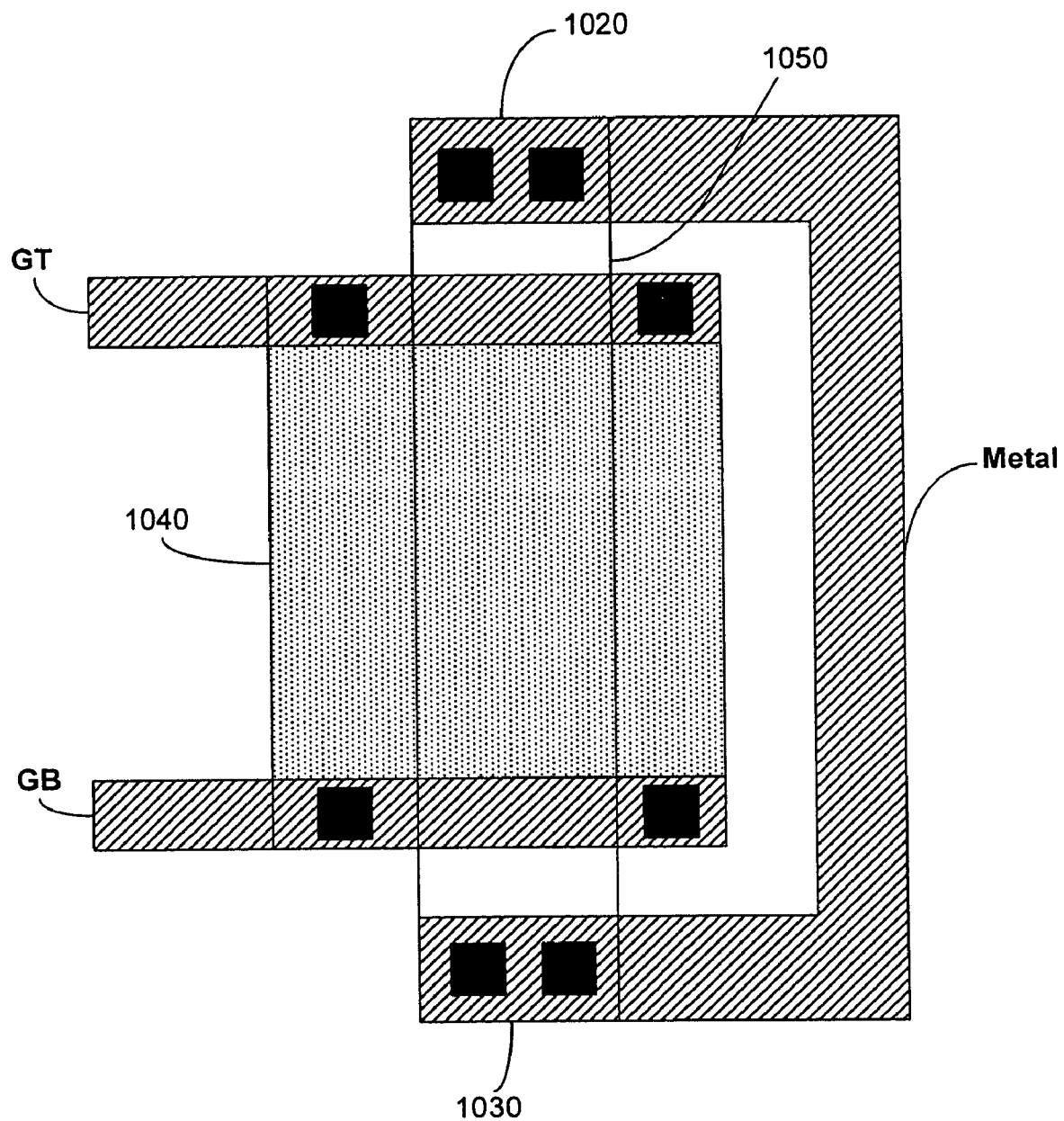
FIG. 10A shows a top view of a more detailed, but still simplified version of the capacitance canceling circuitry of FIG. 10 in accordance with the principles of the present invention.

FIG. 10A shows a top view of a more detailed, but still simplified version of transistor 1010 of FIG. 10 in accordance with the principles of the present invention. FIG. 10A shows drain 1020 and source 1030 shorted together. FIG. 10A shows gate 1040 electrically coupled to $G_T$ and $G_B$. Drain 1020 and source 1030 are both electrically coupled to source/drain diffusion 1050, which spans from drain 1020 to source 1030.

Figure 11:
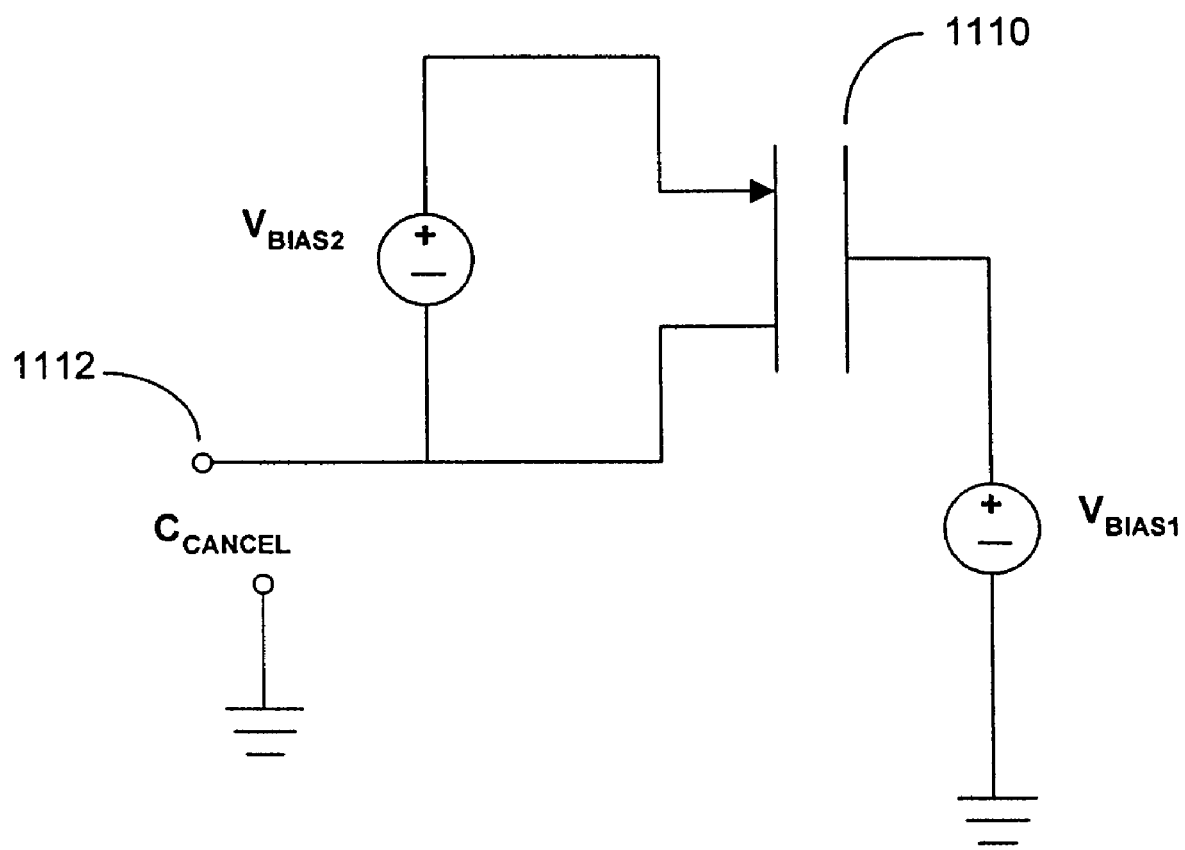
FIG. 11 shows a simplified schematic diagram of another embodiment of yet another capacitance canceling circuitry in accordance with the principles of the present invention.

FIG. 11 shows alternative continuous capacitance canceling circuitry 1100 in accordance with the principles of the present invention. As shown, circuitry includes transistor 1110, voltage source $V_{BIAS1}$, and voltage source $V_{BIAS2}$. The gate of transistor 1110 is coupled to $V_{BIAS1}$ and the source and drain are coupled to each other via $V_{BIAS2}$. The drain of transistor 1112 is coupled to terminal 1112. In circuitry 1100, a "voltage divider" exist between the source and drain, thereby providing circuitry 1000 with the ability to provide continuous fit capacitance cancellation in response to a signal (e.g., voltage signal).

Figure 12:
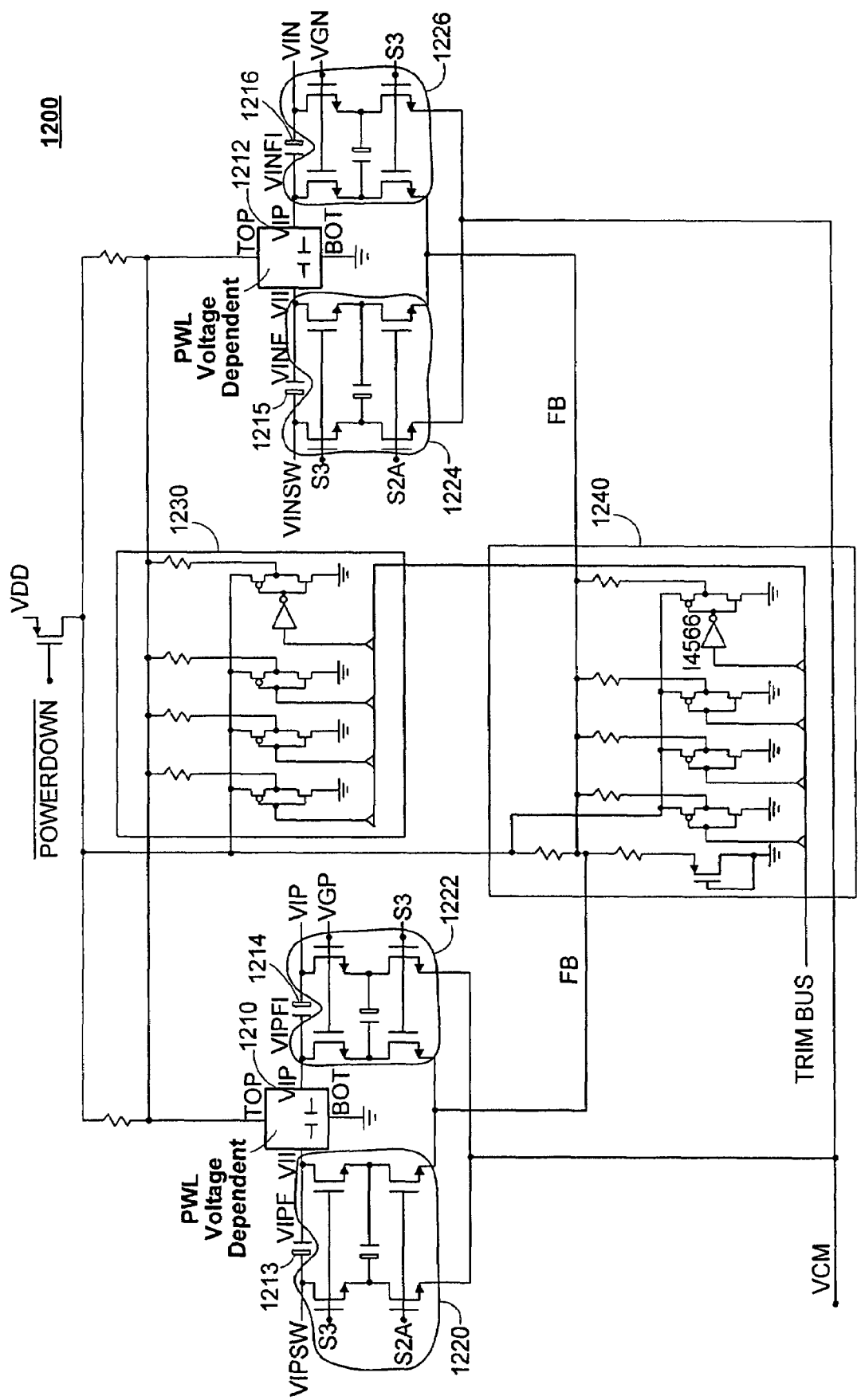
FIG. 12 shows a schematic diagram of an embodiment in which capacitance canceling circuitry according to the invention is used in connection with utilization circuitry.

FIG. 12 shows a schematic diagram of an embodiment in which capacitor canceling circuitry according to the invention is used in connection with utilization circuitry 1200. Utilization circuitry 1200 may be a sample and hold circuit having differential inputs, $V_{IN}$ and $V_{IP}$. An advantage of circuitry 1200 is that it may linearize both sides of a sample switch. This linearization may be accomplished with the assistance of capacitance canceling circuitry 1210 and 1212 (one of which is shown in more detail in FIG. 13). Referring briefly to FIG. 13, a resistor ladder 1310 is shown coupled to two columns of transistors, labeled 1320 and 1330. One column of transistors (e.g., the 1320 column) may linearize the first side of the sample switch and the other column (e.g., the 1330 column) may linearize the second side of the sample switch.

Referring back to FIG. 12, utilization circuitry 1200 includes refresh circuitry 1220, 1222, 1224, and 1226 which may be controlled by control signals provided by control circuitry (not shown). In addition, refresh circuitry 1220, 1222, 1224, and 1226 may receive the sample switch signal, which may also be provided by control circuitry (not shown). A common mode voltage, VCM, may be provided to refresh circuitry 1220, 1222, 1224, and 1226.

Moreover, refresh circuitry 1220, 1222, 1224, and 1226 may be operative to adjust the magnitude of the voltage signals being provided to capacitance canceling circuitry 1210 and 1212 (similar to how voltage shifting circuitry 910 of FIG. 9 can adjust the voltage of the input-Voltage being applied to transistor M1-M8). Note coupling capacitors 1213 and 1214, 1215 and 1216 are coupled to canceling circuitry 1210 and 1212, respectively. These capacitors may adjust the operating range of circuitry 1210 and 1212 (similar to the way coupling capacitor $C_c$ adjusts the operation of canceling circuitry 900 of FIG. 9).

Utilization circuitry 1200 may include trimming bias circuitry 1230 and 1240 which are coupled to VDD and a TRIM Bus. Trimming bias circuitry 1230 may be operative to adjust the bias voltage applied to the resistor tree of canceling circuitry 1210 and 1220. In addition, trimming bias circuitry 1230 may reduce third order harmonics. Trimming bias circuitry 1240 may be operative to set the bias voltage, FB, provided to refresh circuitry 1220, 1222, 1224, and 1226.

Figure 14A:
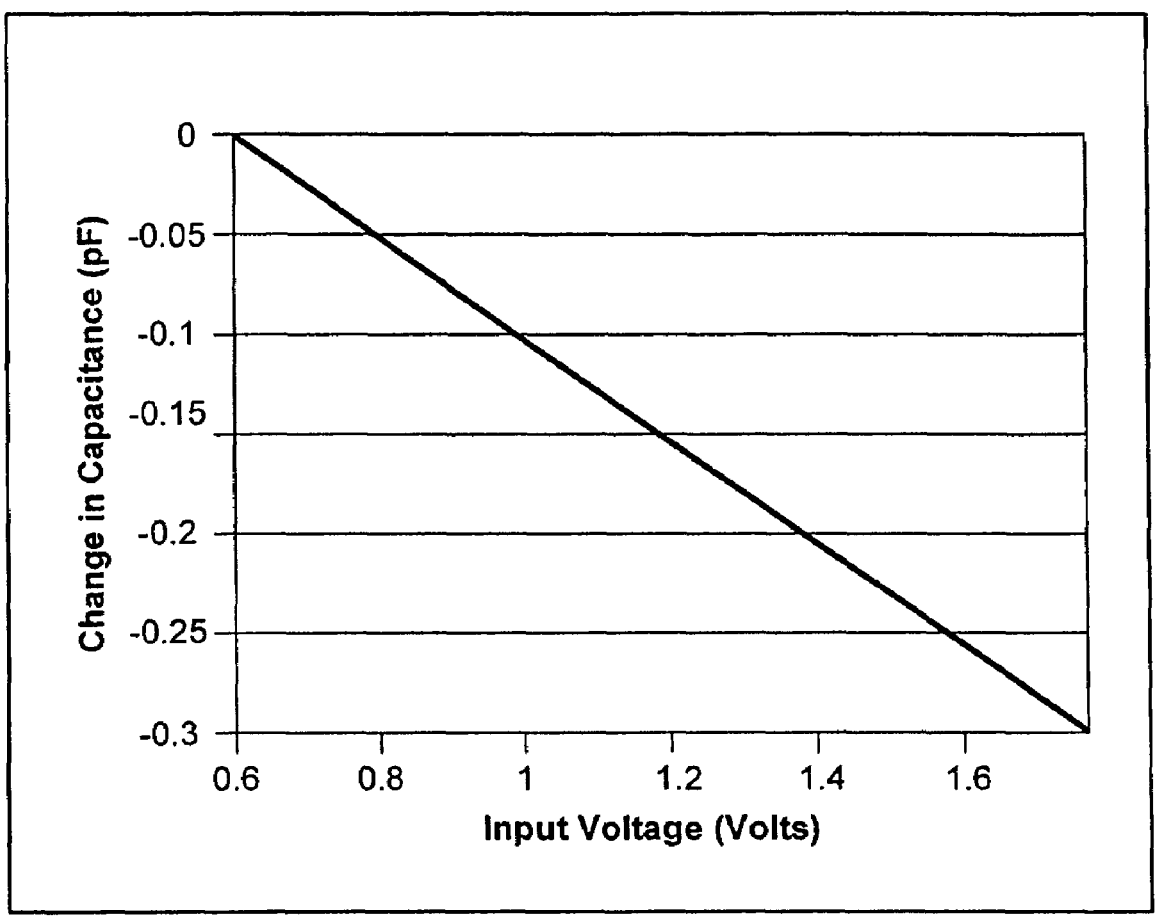
FIG. 14A shows a graph illustrating capacitance as a function of voltage for utilization circuitry not using the capacitance canceling circuitry in accordance with the present invention.
Figure 14B:
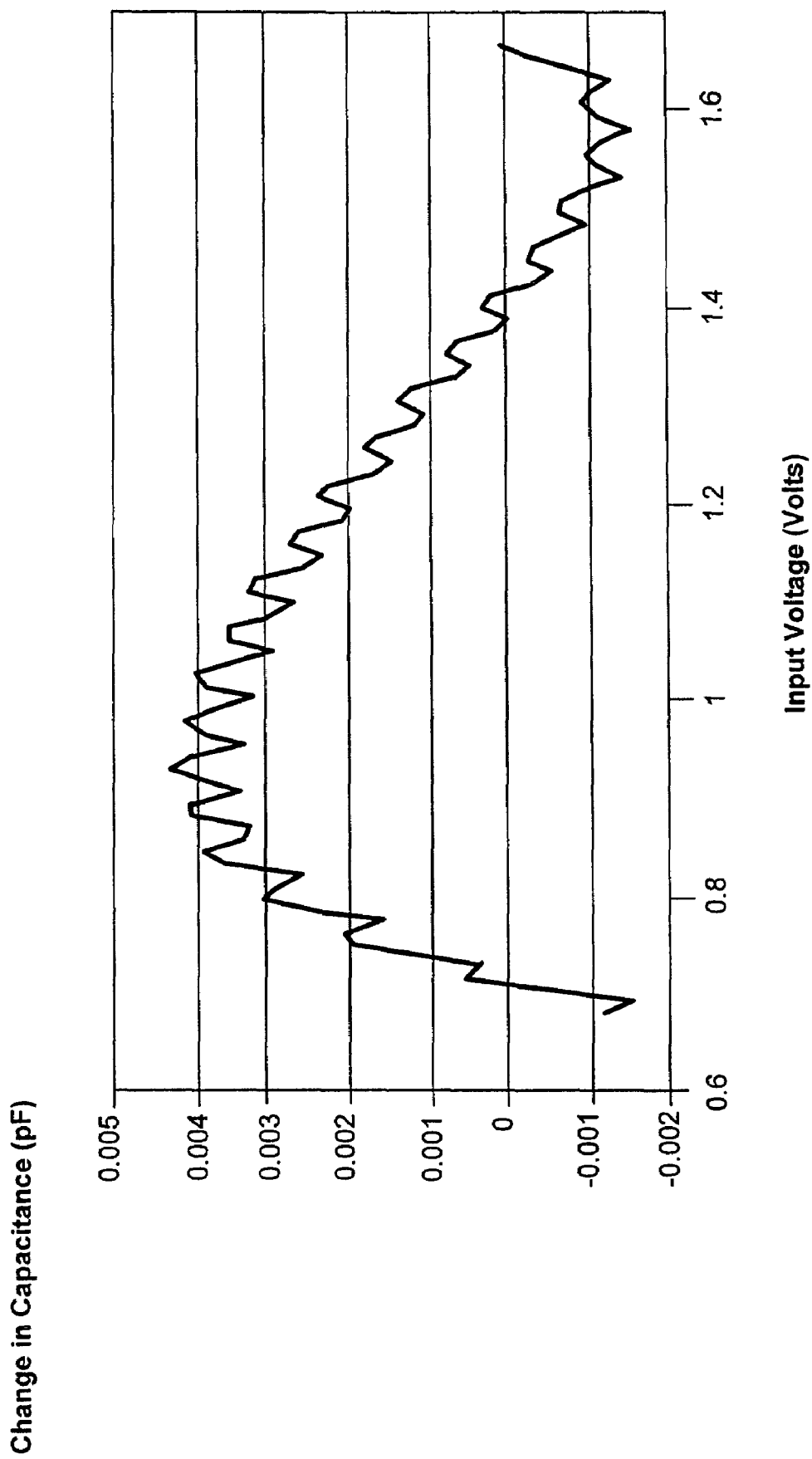
FIG. 14B shows a graph illustrating capacitance as a function of voltage for utilization circuitry using the capacitance canceling circuitry in accordance with the present invention.

FIGS. 14A and 14B graphically show how the capacitance canceling circuitry 1210 of FIG. 12 reduces the magnitude of the signal dependent capacitance of utilization circuitry 1200. In particular, FIG. 14A shows a change in signal dependent capacitance as a function of voltage for utilization circuitry 1200 not electrically coupled to capacitance canceling circuitry. As shown, the change in capacitance is substantial (e.g., nearly 0.3 pF of change) as voltage increases. FIG. 14B shows a change in capacitance as a function of voltage for utilization circuitry 1200 electrically coupled to capacitance canceling circuitry. As shown, the change in capacitance is substantially less (e.g., about 0.005 pF) for utilization circuitry 1200 coupled to capacitance canceling circuitry 1210. In fact, capacitance canceling circuitry 1210 may effectively reduce the magnitude of the signal dependent capacitance by several orders of magnitude. Moreover, by comparing the change in capacitance values of FIGS. 14A and 14B, it is shown that the capacitance canceling circuitry can reduce the magnitude of the capacitance variation by a factor of about fifty.

Figure 7A:
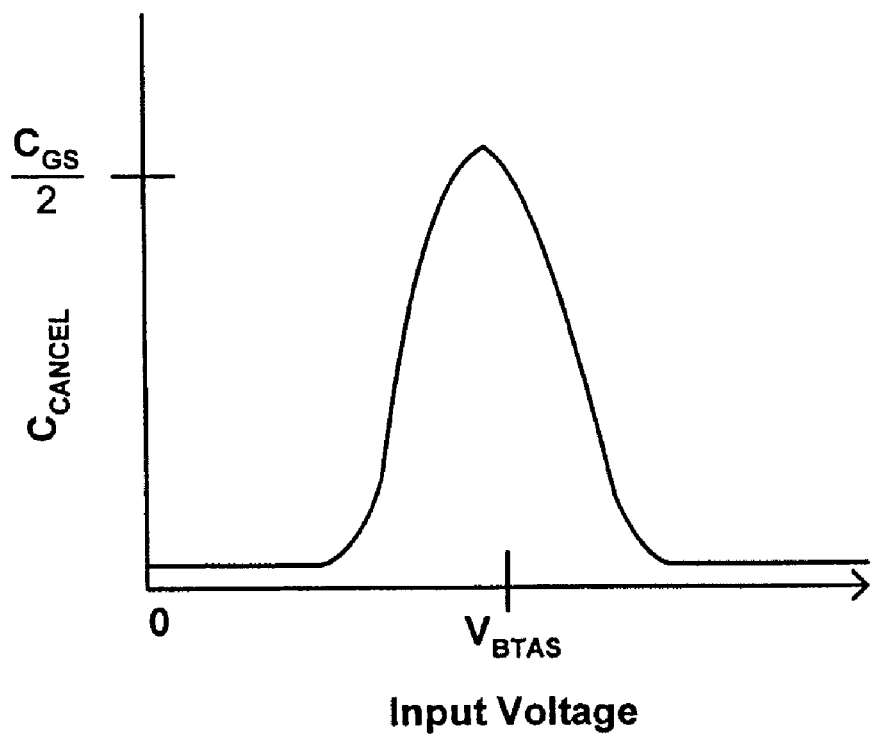
FIG. 7A shows a graph of the cancellation capacitance generated by circuitry of FIG. 7 in accordance with the principles of the present invention.

The circuits described above in, for example, FIGS. 8-12, are all examples of monotionic capacitance canceling circuitry. It will be appreciated that capacitance being cancelled by canceling circuitry of the present invention does not have to be monotonic. The capacitance can be non-monotonic. That is, capacitance can first increase, then decrease, or vice versa. This is illustrated in FIG. 7A with canceling circuitry 700. One possible way to generate a non-monotonic capacitance is to use a combination of both P and N transistors. Those skilled in the art will appreciate that the circuits and methods of the present invention can be used to cancel non-monotonic capacitance as well as monotonic capacitance.

Capacitance canceling circuitry of the present invention may be included on an integrated circuit device such as a multi-pin chip. This integrated circuit may be included as a component of system, which may include a processor, memory controller, input devices, output devices, and other components.

Figure 15:
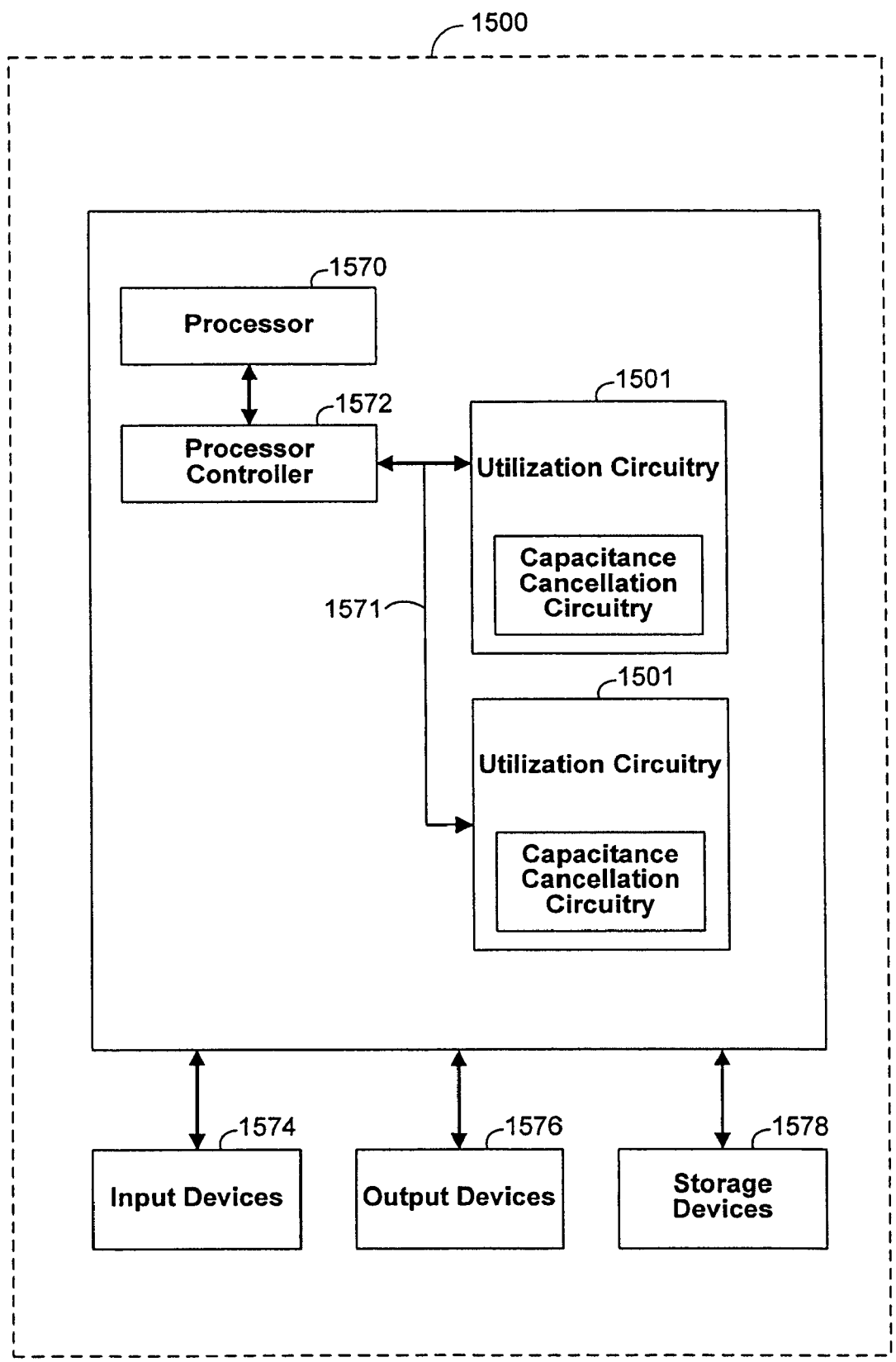
FIG. 15 shows a simplified block diagram of system using capacitance canceling circuitry in accordance with the principles of the present invention.

FIG. 15 shows a system that incorporates the invention. System 1500 may include several utilization circuitry 1501 (e.g., a sample and hold circuit), a processor 1570, a memory controller 1572, input devices 1574, output devices 1576,.and optional storage devices 1578. Capacitance canceling circuitry according to the invention may be used, for example, to enhance operation of utilization circuitry 1501. Data and control signals may be transferred between processor 1570 and memory controller 1572 via bus 1571. Similarly, data and control signals are transferred between memory controller 1572 and utilization circuitry 1501 via bus 1573. Input devices 1574 can include, for example, a keyboard, a mouse, a touch-pad display screen, or any other appropriate device that allows a user to enter information into system 1500. Output devices 1576 can include, for example, a video display unit, a printer, or any other appropriate device capable of providing output data to a user. Note that input devices 1574 and output devices 1576 can alternatively be a single input/output device. Storage devices 1578 can include, for example, one or more disk or tape drives.

It will be understood that the foregoing drain and source orientation and emitter and collector orientation of the transistors described herein is not intended to be limiting, but merely illustrative of one way such transistors can be constructed. Therefore, the terms "source," "drain," "emitter," and "collector" are to be interpreted in their broadest sense.

Thus, capacitance canceling circuitry is provided. One skilled in the art will appreciate that the present invention can be practiced by other than the described embodiments, which are presented for the purposes of illustration and not of limitation.

What is claimed is:

1. A system comprising utilization circuitry having a capacitance and that produces a signal dependent capacitance variable based on a signal, the system comprising:
    capacitance signal dependency canceling circuitry electrically coupled to the utilization circuitry and operative to cancel at least a portion of the signal dependent capacitance by producing a variable cancellation capacitance dependent on the signal.

2. The system defined in claim 1, further comprising:
    a coupling capacitor electrically coupled between the utilization circuitry and capacitance canceling circuitry.

3. The system defined in claim 1, wherein the canceling circuitry comprises at least one switched capacitor element which provides the variable cancellation capacitance in response to a magnitude of the signal.

4. The system defined in claim 3, wherein each switched capacitor element selectively provides one of at least two predetermined capacitances depending on the magnitude of the signal.

5. The system defined in claim 3, wherein at least one switched capacitor element comprises a transistor.

6. The system defined in claim 1, wherein the canceling circuitry comprises a plurality of switched capacitor elements which provide the variable cancellation capacitance in response to a magnitude of the signal.

7. The circuitry of claim 6, wherein each of the switched capacitance elements comprises a transistor, and the transistors of the respective switched capacitance elements have approximately the same size as each other.

8. The circuitry of claim 6, wherein each of the switched capacitance elements comprises a transistor, and the transistors of the respective switched capacitance elements have different sizes from each other.

9. The system defined in claim 1, wherein the canceling circuitry comprises:
    a terminal for receiving the signal;
    a power source;
    a resistor ladder electrically coupled to the power source; and
    a plurality of transistors electrically coupled to the resistor ladder and the terminal, the transistors collectively operative to provide the signal dependent cancellation capacitance to the terminal in response to the received signal.

10. The system defined in claim 1, wherein the canceling circuitry comprises:
    a terminal for receiving the signal;
    a power source providing a voltage; and
    a transistor comprising:
        a source and a drain each coupled to the terminal; and
        a gate having a first gate terminal and a second gate terminal, the first gate terminal coupled to the power source and the voltage is applied across the gate,
    the transistor operative to provide the signal dependent cancellation capacitance to the terminal in response to the received signal.

11. The system defined in claim 1, wherein the canceling circuitry comprises:
    a terminal for receiving the signal;
    first and second power sources each providing a voltage; and
    a transistor comprising:
        a source and a drain each coupled to the first power source, the drain and first power source coupled to the terminal, wherein the voltage from the first power source is applied across the source and drain; and
        a gate coupled to the second power source,
    the transistor operative to provide the signal dependent cancellation capacitance to the terminal in response to the received signal.

12. The system defined in claim 1, wherein the canceling circuitry comprises:
    a terminal for receiving the signal;
    a plurality of nodes each having a different voltage level; and
    a switched capacitor element coupled to each one of the nodes and the terminal, each switched capacitor element operative to selectively provide, to the terminal, one of at least two capacitances in response to a magnitude of the received signal, and wherein a combination of the capacitances provided by each switched capacitor element includes the cancellation capacitance.

13. The system defined in claim 12, wherein each switched capacitor element comprises a transistor.

14. The system defined in claim 12, further comprising a discrete resistor ladder electrically coupled to a power source, the discrete resistor ladder including the plurality of nodes.

15. The system defined in claim 1, further comprising:
    voltage shifting circuitry electrically coupled to a node between the utilization circuitry and the canceling circuitry.

16. The system of claim 1, wherein the signal comprises a voltage signal.

17. The system of claim 1, wherein the signal is selected from the group consisting of a voltage signal, a current signal, a frequency signal, a resistance signal, and a charge signal.

18. The system of claim 1, wherein the variable cancellation canceling capacitance is a voltage dependent canceling capacitance.

19. The system defined in claim 1, where a net capacitance seen by the utilization circuitry is expressed by the following relationship: CNet=UCfixed+CCfixed+UCdependent−CCdependent wherein UCfixed represents a signal independent capacitance of the utilization circuitry, the CCfixed represents a signal independent capacitance of the capacitance canceling circuitry, UCdependent represents a signal dependent capacitance, and CCdependent represents a cancellation capacitance.

20. A method for using capacitance canceling circuitry to reduce signal variation of a signal dependent capacitance, the method comprising:
  receiving a signal;
  providing the signal dependent capacitance based on the received signal; and
  reducing the signal dependent capacitance variation by generating a variable cancellation capacitance dependent on the received signal.

21. The method defined in claim 20, wherein the signal dependent capacitance is defined by at least a linear-signal term, the reducing comprising:
  canceling at least the linear-signal term.

22. The method defined in claim 20, wherein the signal dependent capacitance is defined by a linear-signal term and at least one non-linear-signal term, the reducing comprising:
  canceling at least one of the non-linear-signal terms.

23. The method defined in claim 20, the reducing comprising:
  using at least one switched capacitance element to reduce the signal dependent capacitance.

24. The method defined in claim 20, the reducing comprising:
  using piecewise linear fit capacitance canceling circuitry to reduce the signal dependent capacitance.

25. The method defined in claim 20, the reducing comprising:
  using continuous fit capacitance canceling circuitry to reduce the signal dependent capacitance.

26. The method defined in claim 20, wherein the signal comprises a voltage signal.

27. The method defined in claim 20, wherein the signal is selected from the group consisting of a voltage signal, a current signal, a frequency signal, a resistance signal, and a charge signal.

28. The method defined in claim 20, wherein the variable cancellation capacitance is a voltage dependent canceling capacitance.

29. The method defined in claim 20, further comprising:
  adjusting an operational range of the capacitance canceling circuitry.

30. Voltage dependent capacitance canceling circuitry comprising:
  a terminal for receiving a signal having a voltage level; and
  one or more pairs of a node and a switched capacitor element coupled to the node, wherein each node has a predetermined voltage level and each switched capacitor element is operative to provide at least one of at least two capacitances selectively in response to the voltage level of the received signal to the terminal.

31. The circuitry defined in claim 30, wherein each switched capacitor element provides a cancellation capacitance when the received signal voltage level exceeds the predetermined voltage level of the node coupled to that switched capacitor element.

32. The circuitry defined in claim 30, wherein each switched capacitor element provides an intrinsic capacitance when the received signal voltage level does not exceed the predetermined voltage level of the node coupled to that switched capacitor element.

* * * * *